US006317300B1

(12) United States Patent
Sasaki et al.

(10) Patent No.: US 6,317,300 B1
(45) Date of Patent: Nov. 13, 2001

(54) MAGNETORESISTIVE DEVICE HAVING MAGNETORESISTIVE FILM AND MAGNETIC BIAS FILM WITH SIDE-END FACES WITH DIFFERENT ANGLES OF INCLINATION AND HAVING INSULATING FILM MADE OF ELECTRICALLY INSULATING MATERIAL

(75) Inventors: Yoshitaka Sasaki; Hiroaki Kawashima, both of Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/347,922

(22) Filed: Jul. 6, 1999

(30) Foreign Application Priority Data

Jul. 13, 1998 (JP) .................................................. 10-197241

(51) Int. Cl.$^7$ ...................................................... G11B 5/39
(52) U.S. Cl. .............................................................. 360/325
(58) Field of Search ..................................... 360/313–328

(56) References Cited

U.S. PATENT DOCUMENTS

| 3,864,751 | | 2/1975 | Beaulieu et al. . |
| 5,717,550 | * | 2/1998 | Nepela ............................ 360/327.32 |
| 5,739,987 | * | 4/1998 | Yuan ................................ 360/327.32 |

FOREIGN PATENT DOCUMENTS

| 50-65213 | 6/1975 | (JP) . |
| 61-253620 | 11/1986 | (JP) . |
| 7-320235 | 12/1995 | (JP) . |

OTHER PUBLICATIONS

Mikio Matsuzaki "MR Head for Hard Disk Drive", The Journal of the Institute of Image Information and Television Engineers, vol. 51, No. 6, pp. 777–785, 1997.

* cited by examiner

Primary Examiner—A. J. Heinz
(74) Attorney, Agent, or Firm—Oliff & Berridge, PLC

(57) ABSTRACT

An object of the invention is to minimize the difference in reproducing output of a magnetoresistive device for a reproducing head. An MR device which composes a reproducing head is formed as a laminated structure in which a SAL film, an insulating film and an MR film which is a magnetoresistive film are laminated. The side-end faces of the MR film slope toward the supporting surface of a base body and the side-end faces of the SAL film are formed substantially vertical to the supporting surface of the base body. An insulating film, which is provided in the related art, is not provided on the side-end faces of the MR film and the SAL film so as to make them directly in contact with a first electrode layer. The area of the side-end faces of the SAL film is sufficiently smaller than that of the MR film, and the ratio of both areas can be set to a constant value. The contact resistance between the SAL film and the first electrode layer is sufficiently larger than the current flowing in the MR film and the first electrode layer, and the current flowing in the SAL film becomes sufficiently smaller than that of the MR film. Further, the ratio of the amount of the current flowing in the SAL film to that of the current flowing in the MR film becomes constant and difference in the reproducing output can be suppressed.

13 Claims, 17 Drawing Sheets

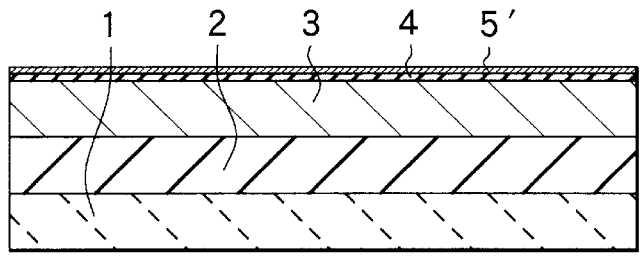
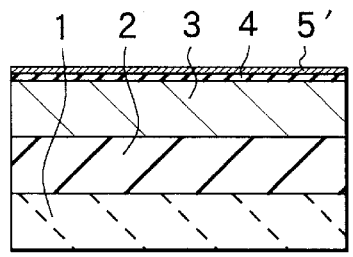
FIG.1A FIG.1B
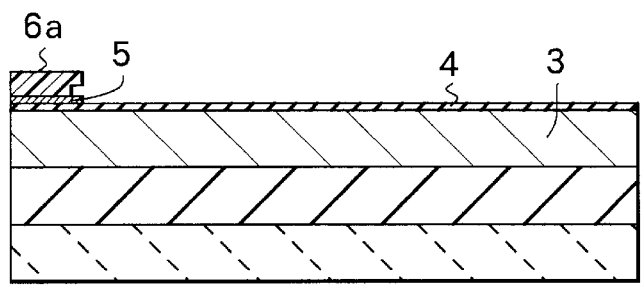
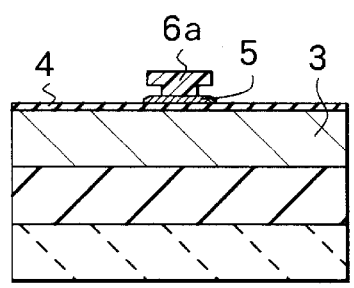
FIG.2A FIG.2B
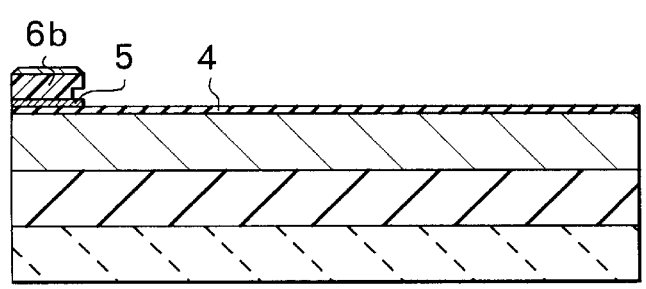
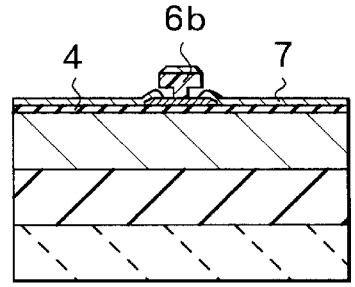
FIG.3A FIG.3B

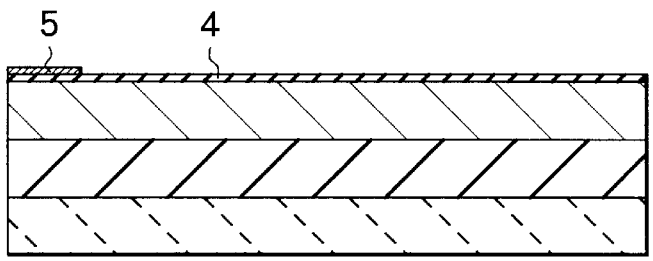
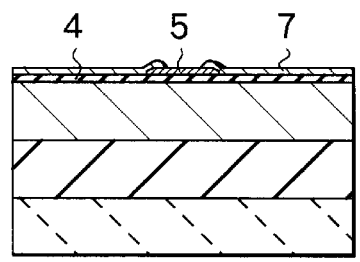
FIG.4A　　　　　　　FIG.4B
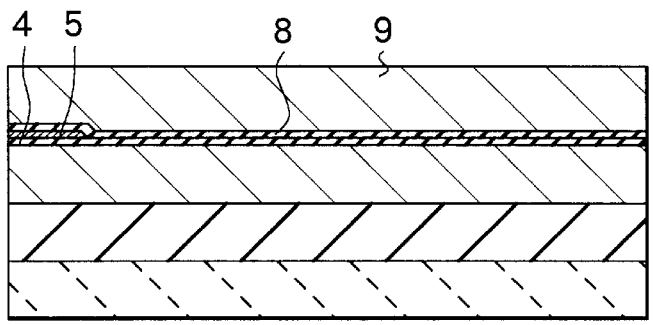
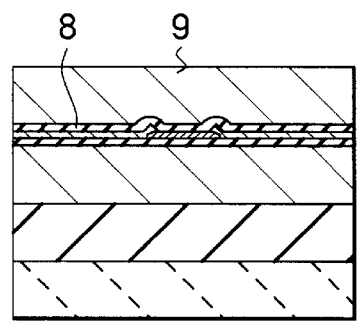
FIG.5A　　　　　　　FIG.5B
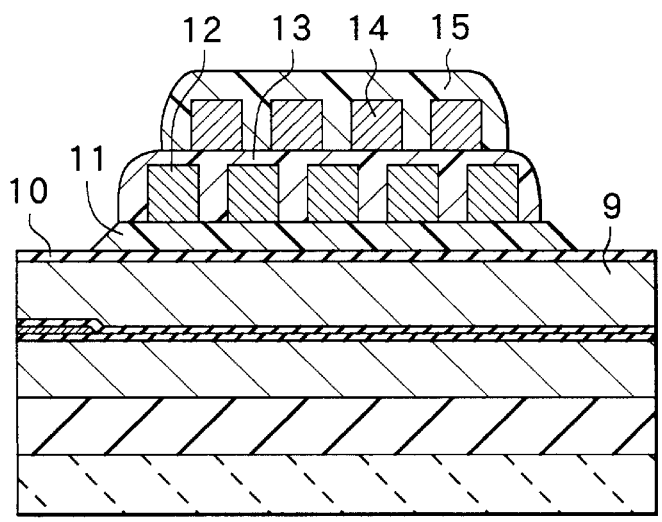
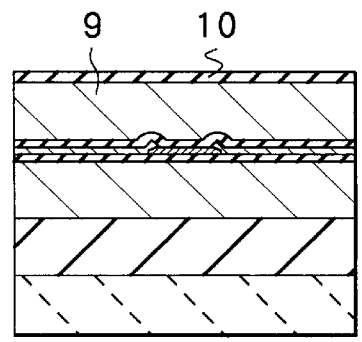
FIG.6A　　　　　　　FIG.6B

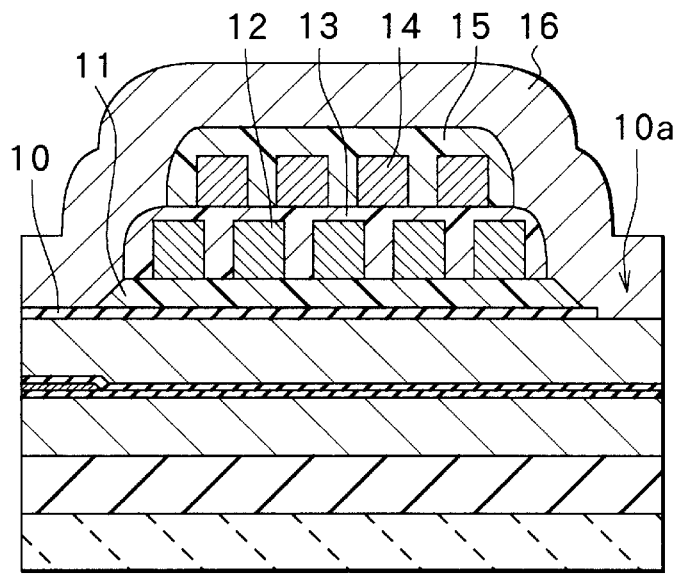
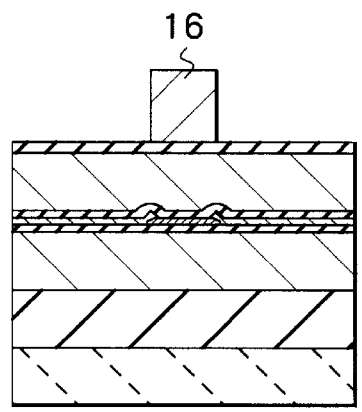
FIG.7A  FIG.7B
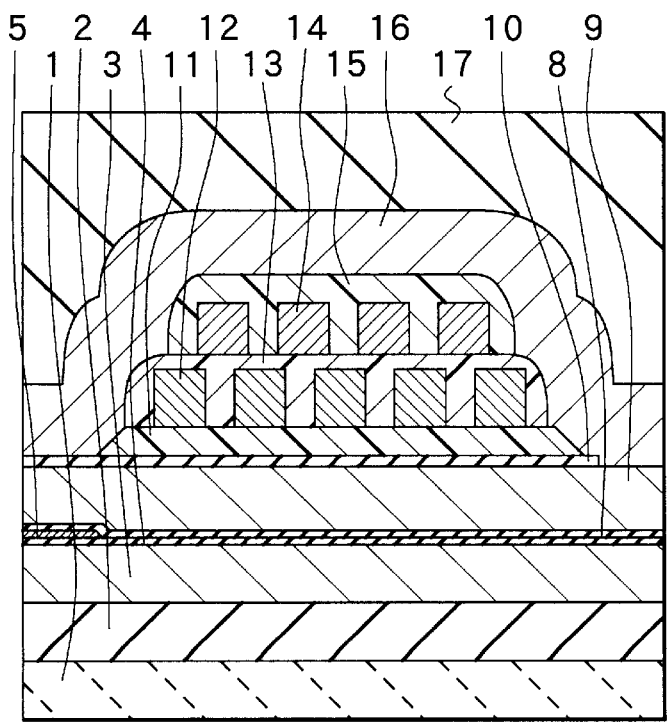
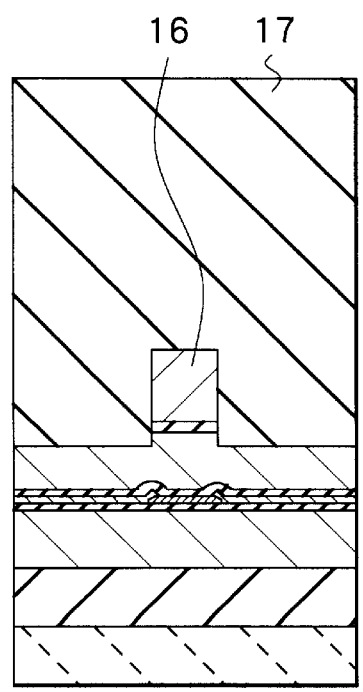
FIG.8A  FIG.8B

MAGNETORESISTIVE DEVICE HAVING MAGNETORESISTIVE FILM AND MAGNETIC BIAS FILM WITH SIDE-END FACES WITH DIFFERENT ANGLES OF INCLINATION AND HAVING INSULATING FILM MADE OF ELECTRICALLY INSULATING MATERIAL

BACKGROUND OF THE INVENTION

1. Field of the Invention

The invention relates to a magnetoresistive device having at least a magnetoresistive film, a thin film magnetic head using at least the magnetoresistive device and methods of manufacturing the same.

2. Description of the Related Art

In recent years, performance improvement in thin film magnetic heads has been sought in accordance with an increase in surface recording density of a hard disk drive. As a thin film magnetic head, a composite thin film magnetic head has been widely used. A composite thin film magnetic head has a layered structure which includes a recording head with an inductive-type magnetic transducer for writing and a reproducing head with a magnetoresistive device (also referred as MR device in the followings) for reading-out. There are a few types of MR devices: one is an AMR device that utilizes the anisotropic magnetoresistance effect (referred as AMR effect in the followings) and the other is a GMR device that utilizes the giant magnetoresistance effect (referred as GMR effect in the followings). A reproducing head using an AMR device is called an AMR head or simply an MR head. A reproducing head using the GMR device is called a GMR head. The AMR head is used as a reproducing head whose surface recording density is more than 1 gigabit per square inch. The GMR head is used as a reproducing head whose surface recording density is more than 3 gigabit per square inch.

The AMR head includes an AMR film having the AMR effect. The GMR head has the similar configuration to the AMR head except that the AMR film is replaced with a GMR film having the GMR effect. However, compared to the AMR film, the GMR film exhibits a greater change in resistance under a specific external magnetic field. Accordingly, the reproducing output of the GMR head becomes about three to five times greater than that of the AMR head.

An MR film may be changed in order to improve the performance of a reproducing head. In general, an AMR film is a film made of a magnetic substance which exhibits the MR effect and has a single-layered structure. In contrast, most of the GMR films have a multi-layered structure consisting of a plurality of films. There are several types of mechanisms which produce the GMR effect. The layer structure of the GMR film depends on those mechanisms. GMR films include a superlattice GMR film, a granular film, a spin valve film and so on. The spin valve film is most sufficient since the film has a relatively simple structure, exhibits a great change in resistance in a low magnetic field, and is suitable for mass production. The performance of a reproducing head is thus easily improved by replacing an AMR film with a GMR film and the like with an excellent magnetoresistive sensitivity.

As a primary factor for determining the performance of a reproducing head, there is a pattern width, especially an MR height, in addition to selection of materials as described. The MR height is the length (height) between the end of an MR element closer to an air bearing surface (the surface to be faced with the recording medium) and the other end. The MR height is originally determined by an amount of grinding when the air bearing surface is processed.

As described, the performance of a reproducing head can be easily improved by replacing the AMR film with the MR film made of a material with better magnetoresistive sensitivity such as the GMR film or the like. The GMR films, however, are still under development except for a spin-valve GMR film and need more study. Accordingly, it has been tried to manufacture a reproducing head which is applicable to a higher surface recording density such as 3–4 gigabit inches per square or more while using the AMR film of the related art.

Incidentally, the MR film is not used by itself in general, but is used in combination with another magnetic film for applying a lateral magnetizing bias field to the MR film. As used herein, the lateral magnetizing bias field is a magnetizing bias field in a direction orthogonal to the direction of sense current which is applied to the MR film for sensing resistance change of the MR film. The magnetizing bias field is applied so as to perform reproduction using the linear region among the resistance-change curve of the MR film (curve in which the relation of magnetic field H applied from outside and change in resistance $\rho$ of the MR film is plotted). Methods for applying the lateral magnetizing bias field include self biasing, shunt biasing, soft-film biasing and so on, as introduced in "THE JOURNAL OF THE INSTITUTE OF IMAGE INFORMATION AND TELEVISION ENGINEERS" Vol. 51, No. 6, issued in June 1997, published by THE INSTITUTE OF IMAGE INFORMATION AND TELEVISION ENGINEERS.

The first one of these techniques, the self-biasing includes the steps of: placing the MR film closer to one of magnetic separation layers (shield layer) which sandwich the MR film; applying sense current to the MR film in order to magnetize the adjacent magnetic separation layer by the generated magnetic field; and applying the magnetic field generated from the magnetized magnetic separation layer to the MR film as the magnetizing bias field. The second one, the shunt biasing is, as disclosed in, for example, Japanese Patent Application laid-open Sho 61-253620, a method in which a nonmagnetic conductive thin film is placed adjacent to the MR film and the magnetic field generated by current flowing in the nonmagnetic conductive thin film is used as the magnetizing bias field. The third one, the soft-film biasing includes the steps of: placing a soft magnetic film called SAL (Soft Adjacent Layer) adjacent to the MR film with the magnetic shield film in between; applying sense current to the MR film in order to magnetize the adjacent magnetic separation layer by the generated magnetic field; and applying the magnetic field generated from the soft film to the MR film as a lateral magnetizing bias field, as disclosed in, for example, Japanese Patent Application laid-open Sho 50-65213.

Among the techniques described above, the soft-film biasing is in the most widespread use. In this method, originally, the film made of tantalum (Ta) which is conductive is mostly used as the magnetic shield film to be inserted between the MR film and the soft film. In such a case, however, sense current flows not only into the MR film but also into other films (that is, magnetic shield film and soft film). This causes the current flowing in the MR film to become less so that reproducing output is decreased. A method to overcome this problem is to insulate the MR film and the soft film electrically by using an insulating film made of alumina ($Al_2O_3$) or other materials as the magnetic shield film so that the sense current only flows into the MR film. This method contributes to prevent decrease in reproducing output since, as a rule, all the sense current flows into the MR film without flowing in the soft film. However, if there is a short-circuit due to incomplete insulation between the MR film and the soft film, improving the reproducing output as described above is not achieved. Accordingly, a technique for preventing a short-circuit between the MR film and the soft film in the manufacturing procedure is disclosed in, for example, Japanese Patent Application laid-open Hei 7-320235.

Now, the principal point of a method of manufacturing a thin film magnetic head of the related art with the MR device composed of a SAL film, a film made of alumina and the MR film will be described with reference to FIG. 26 to FIG. 30. Further, FIG. 26 to FIG. 30 show enlarged cross sections parallel to the air bearing surface of the reproducing head.

In the manufacturing method of the related art, first, as shown in FIG. 26, an insulating layer 102 made of, for example, alumina is deposited on a substrate 101 made of, for example, altic ($Al_2O_3$—TiC). Further, a bottom shield layer 103 for a reproducing head made of a magnetic material is formed on the insulating layer 102. Next, a bottom shield gap film 104 as an insulating layer is formed by depositing, for example, alumina on the bottom shield layer 103.

Next, an MR laminated film 105' is formed by laminating a SAL film 105a', an insulating film 105b' and an MR film 105c' in order on the bottom shield gap film 104. The SAL film 105a' is formed as a soft magnetic film and the insulating film 105b' is formed using, for example, alumina while the MR film 105c' is formed using, for example, permalloy (Ni—Fe). Further, in FIG. 26, the SAL film 105a', the insulating film 105b' and the MR film 105c' are drawn thicker than as they actually are compared to the film of other layers.

Next, as shown in FIG. 27, a photoresist pattern 106a with a T-shaped cross section for simplifying lift-off, which is to be performed later, is selectively formed in a position on the MR laminated film 105', where an MR device 105 is to be formed. Next, a pattern of the MR device 105 composed of a SAL film 105a, an insulating film 105b and an MR film 105c is formed by etching the MR film 105c', the insulating film 105b' and the SAL film 105a' composing the MR laminated layer 105' in order. The etching is performed by oblique ion milling method with the photoresist pattern 106a being a mask. In the ion milling process, ion beam is irradiated to the MR film 105c' from the oblique direction. As a result, the side-end faces of the SAL film 105a, the insulating film 105b and the MR film 105c slope toward the bottom shield gap film 104.

Next, as shown in FIG. 28, an insulating film 105d made of, for example, alumina is formed to a thickness of about 10 nm by using the photoresist pattern 106a as a mask which is used at the time of forming the MR device 105. Through this, each of the side-end faces of the SAL film 105a, the insulating film 105b and the MR film 105c composing the MR device 105 are covered with the insulating film 105d. Next, the photoresist pattern 106a is removed by lift-off together with the unwanted part of the insulating film 105d.

Next, as shown in FIG. 29, a photoresist pattern 106b is formed substantially in the center of the MR film 105c of the MR device 105. The photoresist pattern 106b is also formed so that its cross section takes a T-shape like the photoresist pattern 106a. The width of the photoresist pattern 106b is, however, made smaller than that of the photoresist pattern 106a. A pair of first electrode layers 107, which are electrically connected to the MR device 105 as an lead electrode, are formed on the bottom shield gap film 104 with the photoresist pattern 106b being a mask. At this time, the first electrode layers 107 are insulated from the side-end faces of the MR device 105 by the insulating film 105d covering the area from the bottom shield gap film 104 to the side-end faces of the MR device 105, while being electrically connected only to the MR film 105c' to part of the top surface at both ends of the MR film 105c of the MR device 105.

Next, as shown in FIG. 30, after the photoresist pattern 106b is removed by lift-off together with the unwanted part of the first electrode layers 107, a pair of second electrode layers, not shown in figure, which are electrically connected to the first electrode layers 107 respectively in areas in the back of the paper, are formed to a predetermined pattern. The first electrode layers 107 and the second electrode layers compose a lead electrode which is electrically connected to the MR device 105. Next, a top shield gap film 108 as an insulating layer made of such as aluminium nitride is formed to cover the bottom shield gap film 104 and the MR device 105, and the MR device 105 is buried between the shield gap films 104 and 108. Next, a top shield layer which also works as the bottom pole (referred as top shield layer in the followings) 109, which is made of a magnetic material and is used both for the reproducing head and for the recording head, is formed on the top shield gap film 108.

The process of forming the portion of the reproducing head in a composite thin film magnetic head of the related art is hereby completed. The process of forming the portion of the recording head is carried out thereafter.

As described, in the method of manufacturing a thin film magnetic head of the related art, the MR film 105c', the insulating film 105b' and the SAL film 105a' composing the MR laminated film 105' are etched at one step by ion milling method in the step of forming the MR device 105 composing the reproducing head. The insulating film 105b', which is the middle layer, has a lower etching rate compared to that of other two layers (SAL film 105a' and MR film 105c') so that the side-end faces of the insulting film 105b does not have the same slant as that of other two layers. Further, the side-end portion of the insulating film 105b remains protruded from between the side-end faces of other two layers taking an overhang shape. As a result, as shown in FIG. 31, the insulating film 105d is to have pin holes PH which are formed below the overhang portion, and the insulating ability of the insulating film 105d changes if there exist the pin holes PH. If the insulating film 105d of the manufactured head has the pin holes PH, current may flow into the SAL film 105a and the amount of the current flowing to the MR film 105c decreases. Accordingly, there is a problem that the reproducing output characteristic varies among reproducing heads.

Japanese Patent Application laid-open Hei 7-320235 mentioned above discloses a method in which knoop hardness of the soft film is increased in order to suppress short-circuit in the MR film and the soft film, which is likely to occur in the step of polishing the air bearing surface in the manufacturing procedure. However, there is no consideration disclosed for the problem as mentioned above, that is, the reproducing output varies among heads due to the difference in the insulating ability of the thin insulating film provided between the lead electrode layer (first electrode layer 107) and the soft magnetic film (SAL film 105a).

The invention is designed to overcome the foregoing problems. An object of the invention is to provide a magnetoresistive device which enables a stable operation with less variations in output obtained through magnetoresistance, a thin film magnetic head formed by using at least such a magnetoresistive device, which can perform stable operation and methods of manufacturing the same.

SUMMARY OF THE INVENTION

A magnetoresistive device of the invention comprises: a magnetoresistive film; a magnetic film for applying magnetizing bias field; a first insulating film as a magnetic shield film sandwiched in between the magnetoresistive film and the magnetic film for applying magnetizing bias field; lead electrodes placed to be electrically connected to at least part of the magnetoresistive film; and a base body supporting the magnetoresistive film, the first insulating film, the magnetic film for applying magnetizing bias field and the lead electrode layer; wherein: side-end faces of the magnetoresistive film slope toward the supporting surface of the base body; and at least side-end faces of the magnetic film for applying magnetizing bias field form surfaces substantially vertical to the supporting surface of the base body.

As used herein, "side-end face" means a surface which crosses a main surface of the film-shaped body among the surfaces composing the film-shaped body. The "main surface" means a surface with the largest area among the surfaces composing the film-shaped body, which usually is a film surface substantially orthogonal to a film-thickness direction. It is so in the following descriptions as well.

In the magnetoresistive device of the invention, at least part of the magnetoresistive film is electrically connected to the lead electrode layer. The side-end faces of the magnetoresistive film slope toward a supporting surface of the base body and the area is relatively large while the side-end faces of the magnetic film for applying magnetizing bias field are substantially vertical to the supporting surface of the base body and the area is relatively small.

Another magnetoresistive device of the invention comprises: a magnetoresistive film; a magnetic film for applying magnetizing bias field; a first insulating film as a magnetic shield film sandwiched in between the magnetoresistive film and the magnetic film for applying magnetizing bias field; lead electrodes placed to be electrically connected to at least side-end face of the magnetoresistive film and side-end faces of the magnetic film for applying magnetizing bias field; and a base body supporting the magnetoresistive film, the first insulating film, the magnetic film for applying magnetizing bias field and the lead electrode layer; wherein: side-end faces of the magnetoresistive film form slope toward the supporting surface of the base body; and at least side-end faces of the magnetic film for applying magnetizing bias field form surfaces substantially vertical to the supporting surface of the base body.

In the magnetoresistive device of the invention, both the side-end faces (slopes) of the magnetoresistive film and the side-end faces (vertical surfaces) of the magnetic film for applying magnetizing bias field are electrically connected to the lead electrode layer. The contact area of the side-end faces of the magnetoresistive film with the lead electrode layer is large and the contact resistance is small while the contact area of the side-end faces of the magnetic film for applying magnetizing bias field with the lead electrode layer is small and the contact resistance is large. Accordingly, a large amount of current flows into the magnetoresistive film and a very little current flows into the magnetic film for applying magnetizing bias field. In this configuration, the ratio of the current flowing in the magnetoresistive film to the current flowing in the magnetic film for applying magnetizing bias field depends on the ratio of the area of the side-end faces of the two films which are in contact with lead electrode layer. The ratio of the above-mentioned areas can be stabilized, which means, the ratio of the above-mentioned current is stabilized.

Still another magnetoresistive device of the invention comprises: a magnetoresistive film; a magnetic film for applying magnetizing bias field; a first insulating film as a magnetic shield film sandwiched in between the magnetoresistive film and the magnetic film for applying magnetizing bias field; a second insulating film placed to cover at least the side-end faces of the magnetic film for applying magnetizing bias field; lead electrodes placed to be electrically connected to at least either the side-end faces or their neighboring surfaces of the magnetoresistive film; and a base body supporting the magnetoresistive film, the first insulating film, the magnetic film for applying magnetizing bias field, the lead electrode layer and the second insulating film; wherein: side-end faces of the magnetoresistive film slope toward the supporting surface of the base body; and at least side-end faces of the magnetic film for applying magnetizing bias field form surfaces substantially vertical to the supporting surface of the base body.

In the magnetoresistive device of the invention, at least either the side-end faces or their adjacent surfaces of the magnetoresistive film are electrically connected to the lead electrode layer. On the other hand, the side-end faces of the magnetic film for applying magnetizing bias field are insulated from the lead electrode layer by the second insulating film. Accordingly, as a rule, the current only flows into the magnetoresistive film without flowing in the magnetic film for applying magnetizing bias field. Further, the side-end faces of the magnetic film for applying magnetizing bias field are formed to be substantially vertical to the supporting surface of the base body so that a problem of the insulating ability variations of the second insulating film may not occur. As a result, the amount of the current flowing in the magnetoresistive film is stabilized.

Further, in the magnetoresistive device of the invention, the magnetic film for applying magnetizing bias field may be for applying a lateral magnetizing bias field, which is orthogonal to the direction of current for sensing resistance change flowing in the magnetoresistive film, to the magnetoresistive film.

Further, the magnetoresistive device of the invention, the magnetic film for applying magnetizing bias field may be formed using a soft magnetic film.

Further, the magnetoresistive device of the invention, the angle formed by the side-end faces of the magnetoresistive film and the supporting surface of the base body may lie within a range of 10° to 30°.

A thin film magnetic head of the invention is a thin film magnetic head comprising a magnetoresistive device for reproducing information from a recording medium wherein the magnetoresistive device has a configuration mentioned above.

Further, the thin film magnetic head of the invention may further include two magnetic shield layers for magnetically shielding the magnetoresistive device from others, placed to sandwich the magnetoresistive device in between.

Further, the thin film magnetic head of the invention may further comprise: an inductive-type magnetic transducer including: two magnetic layers magnetically coupled to each other, each made of at least one layer, including magnetic poles in part of sides of the area facing a recording medium, the magnetic poles being opposed to each other with a gap layer in between; and a thin film coil provided between the two magnetic layers.

A method of manufacturing a magnetoresistive device or a method of manufacturing a thin film magnetic head of the invention device includes the steps of: forming a magnetoresistive film and a magnetic film for applying magnetizing bias field so as to sandwich a first insulating film as a magnetic shield film using a base body as a supporting member; patterning the magnetoresistive film so that side-end faces of the magnetoresistive film slope toward the supporting surface of the base body; patterning at least the magnetic film for applying magnetizing bias field so that side-end faces of the magnetic film for applying magnetizing bias field form surfaces substantially vertical to the supporting surface of the base body; and forming lead electrodes to be electrically connected to at least part of the patterned magnetoresistive film.

Another method of manufacturing a magnetoresistive device or method of manufacturing a thin film head of the invention includes the steps of: forming a magnetoresistive film and a magnetic film for applying magnetizing bias field so as to sandwich a first insulating film as a magnetic shield film using a base body as a supporting member; patterning the magnetoresistive film so that side-end faces of the magnetoresistive film slope toward the supporting surface of the base body; patterning at least the magnetic film for applying magnetizing bias field so that side-end faces of the magnetic film for applying magnetizing bias field form surfaces substantially vertical to the supporting surface of the base body; and forming lead electrodes to be electrically connected to at least the side-end faces of the patterned magnetoresistive film and the side-end faces of the patterned magnetic film for applying magnetizing bias field.

Still another method of manufacturing a magnetoresistive device or method of manufacturing a thin film magnetic head of the invention includes the steps of: forming a magnetoresistive film and a magnetic film for applying magnetizing bias field so as to sandwich a first insulating film as a magnetic shield film using a base body as a supporting member; patterning the magnetoresistive film so that side-end faces of the magnetoresistive film slope toward the supporting surface of the base body; patterning at least the magnetic film for applying magnetizing bias field so that side-end faces of the magnetic film for applying magnetizing bias field form surfaces substantially vertical to the supporting surface of the base body; forming a second insulating film to cover at least the side-end faces of the patterned magnetic film for applying magnetizing bias field; and forming lead electrodes to be electrically connected to at least either the side-end faces or their neighboring surfaces of the patterned magnetoresistive film.

In the method of manufacturing a magnetoresitive device or the method of manufacturing a thin film magnetic head of the invention, the magnetic film for applying magnetizing bias field may be for applying a lateral magnetizing bias field, which is orthogonal to the direction of current flowing in the magnetoresistive film for sensing resistance change, to the magnetoresistive film.

Further, in the method of manufacturing a magnetoresistive device or the method of manufacturing a thin film magnetic head of the invention, the magnetic film for applying magnetizing bias field may be formed of a soft magnetic film.

Further, the method of manufacturing a magnetoresistive device or the method of manufacturing a thin film magnetic head of the invention, the step of patterning the magnetoresistive film is carried out so that the angle formed by the side-end faces of the magnetoresistive film and the supporting surface of the base body may lie in a range of 10° to 30°.

Further, the method of manufacturing a magnetoresistive device or the method of manufacturing a thin film magnetic head of the invention, the step of patterning the magnetoresistive film may be carried out by etching using ion beam.

Further, the method of manufacturing a magnetoresistive device or the method of manufacturing a thin film magnetic head of the invention, the step of patterning the magnetic film for applying magnetizing bias field may be carried out by anisotropic etching.

Further, the method of manufacturing a magnetoresistive device or the method of manufacturing a thin film magnetic head of the invention, the step of patterning the magnetoresistive film may be carried out before the step of patterning the magnetic film for applying magnetizing bias field is carried out.

Further, the method of manufacturing a magnetoresistive device or the method of manufacturing a thin film magnetic head of the invention, the step of patterning the magnetoresistive film may be carried out after the step of patterning the magnetic film for applying magnetizing bias field is completed.

Further, the method of manufacturing a thin film magnetic head may further include the steps of: forming a first magnetic shield layer; forming a first shield gap film on the first magnetic shield layer; forming a magnetoresistive device on the first shield gap film; forming a second shield gap film on the magnetoresistive device; and forming a second magnetic shield layer on the second shield gap film.

Further, the method of manufacturing a thin film magnetic head of the invention may further includes the steps of: forming an inductive-type magnetic transducer including: two magnetic layers magnetically coupled to each other, each made of at least one layer, including magnetic poles in part of sides of the area facing a recording medium, the magnetic poles being opposed to each other with a gap layer in between; and a thin film coil provided between the two magnetic layers.

Other and further objects, features and advantages of the invention will appear more fully from the following description.

BRIEF DESCRIPTION OF THE DRAWINGS

FIGS. 1A and 1B are cross sections for describing one step in a method of manufacturing a thin film magnetic head according to a first embodiment of the invention.

FIGS. 2A and 2B are cross sections for describing a step following the step shown in FIGS. 1A and 1B.

FIGS. 3A and 3B are cross sections for describing a step following the step shown in FIGS. 2A and 2B.

FIGS. 4A and 4B are cross sections for describing a step following the step shown in FIGS. 3A and 3B.

FIGS. 5A and 5B are cross sections for describing a step following the step shown in FIGS. 4A and 4B.

FIGS. 6A and 6B are cross sections for describing a step following the step shown in FIGS. 5A and 5B.

FIGS. 7A and 7B are cross sections for describing a step following the step shown in FIGS. 6A and 6B.

FIGS. 8A and 8B are cross sections for describing a step following the step shown in FIGS. 7A and 7B.

DETAILED DESCRIPTION OF THE PREFERRED EMBODIMENTS

Figure 9:
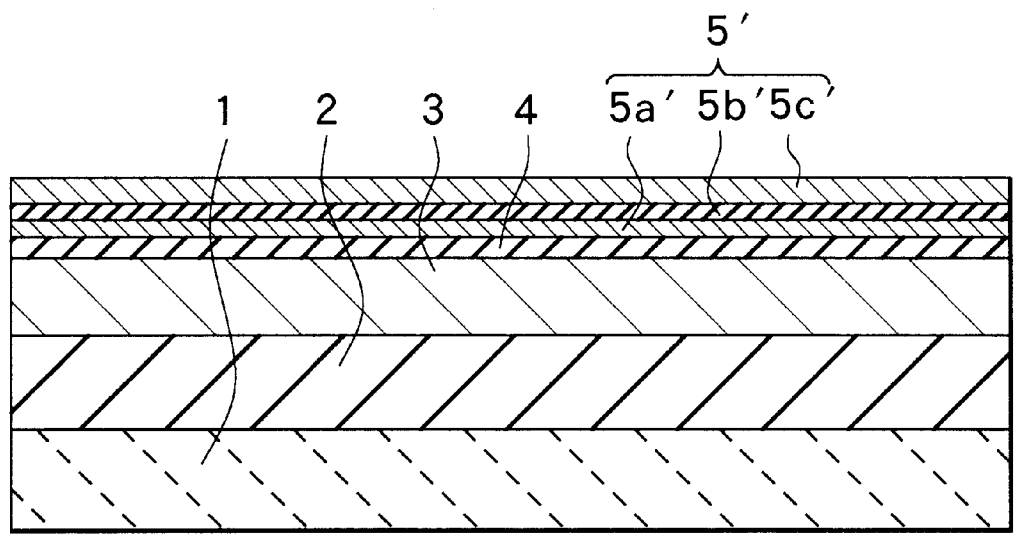
FIG. 9 is a cross section for describing one step in a method of manufacturing a thin film magnetic head according to the first embodiment of the invention, and is an enlarged cross section parallel to the air bearing surface.

Embodiments of the invention will be described by referring to the drawings in the followings.
[First Embodiment]

Figure 16:
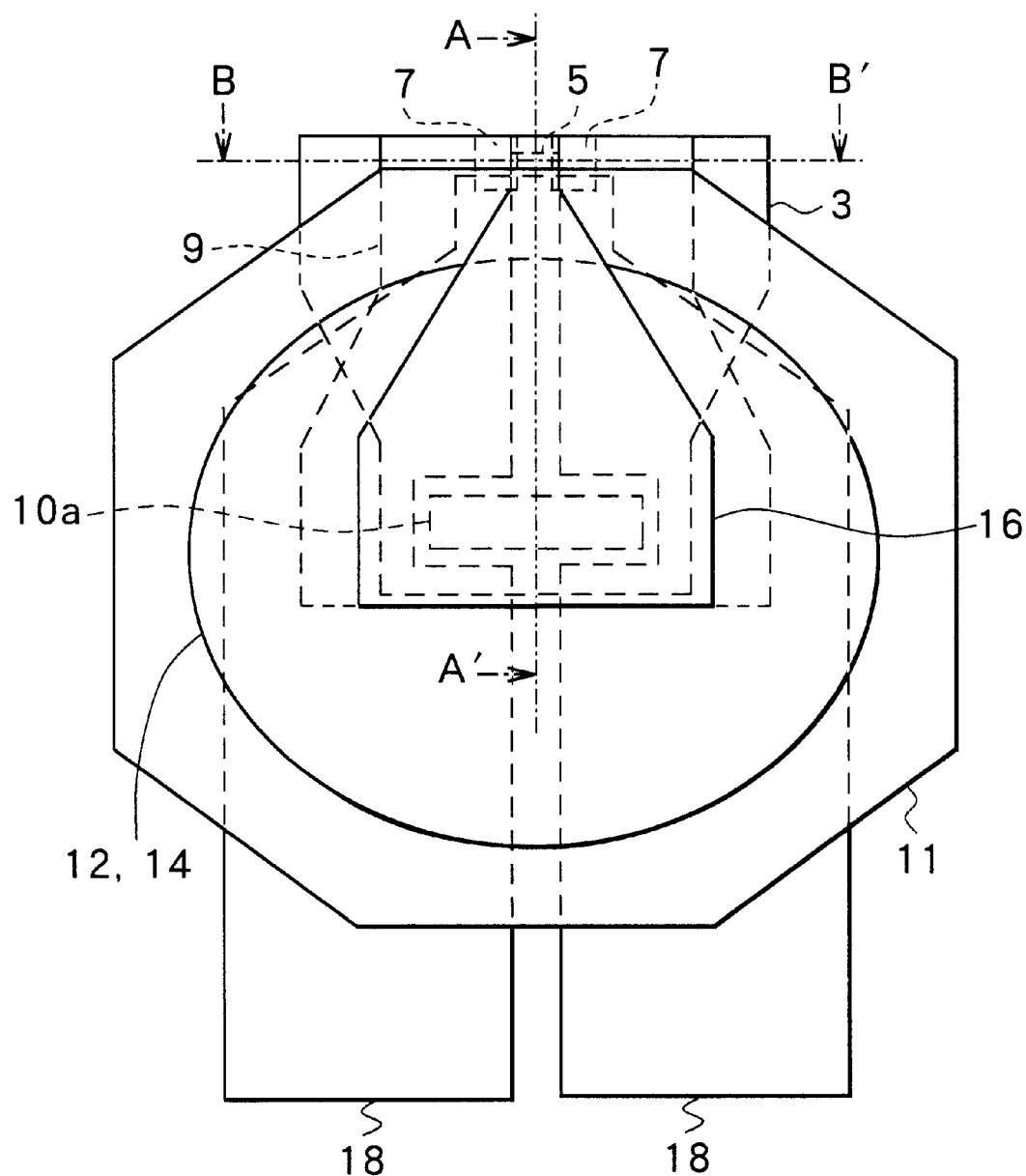
FIG. 16 is a plan view of a thin film magnetic head according to the first embodiment of the invention.
Figure 17:
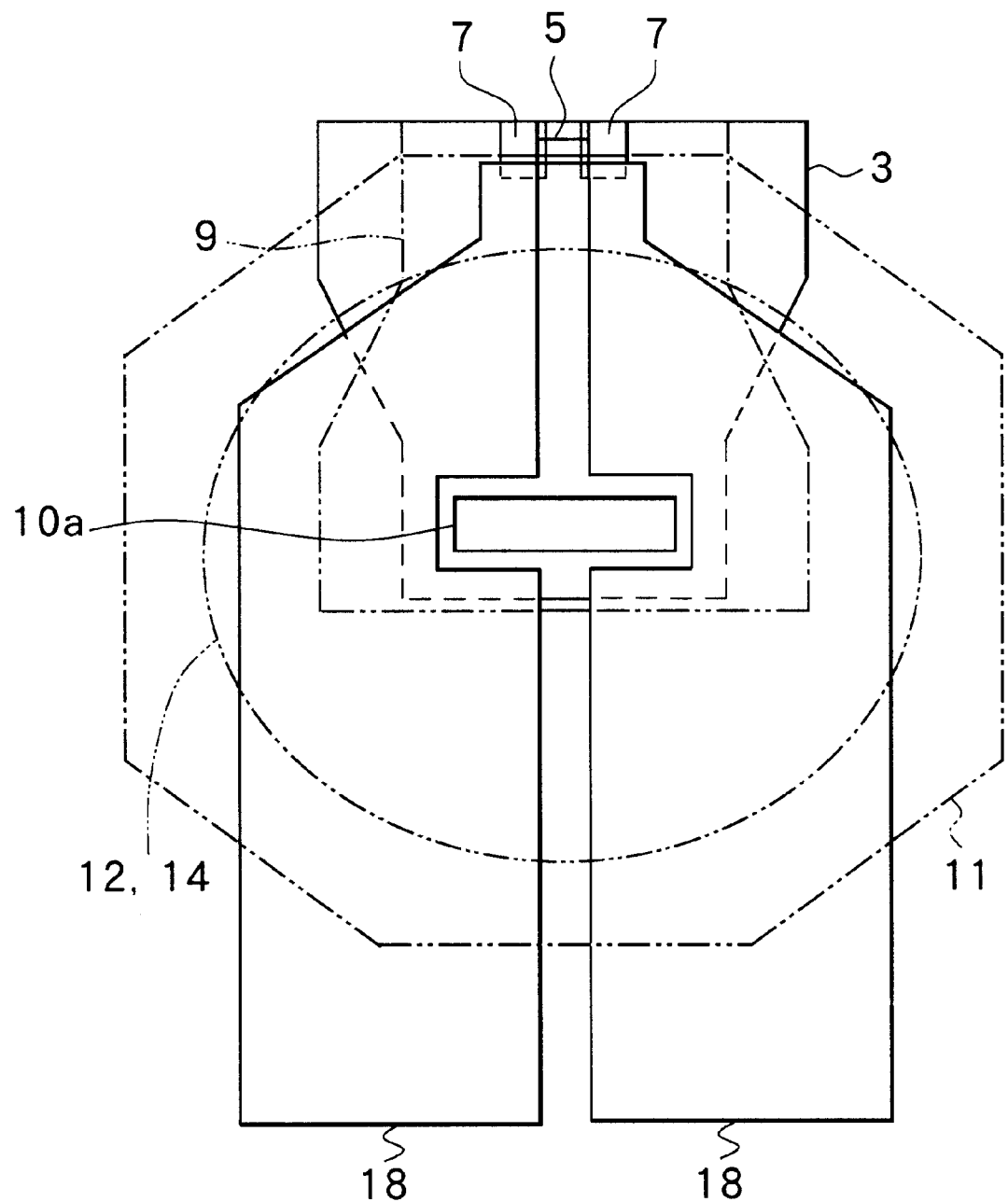
FIG. 17 is a plan view showing an uncompleted state of a thin film magnetic head according to the first embodiment of the invention.

First, a method of manufacturing a composite thin film magnetic head as a method of manufacturing a thin film magnetic head according to a first embodiment of the invention will be described with reference to FIGS. 1A, 1B to FIG. 17. In FIG. 1A to FIG. 8A, "A" shows a cross section vertical to the air bearing surface and in FIG. 1B to FIG. 8B "B" shows a cross section of the magnetic pole portion parallel to the air bearing surface. FIG. 9 to FIG. 15 show enlarged cross sections of the magnetic pole portion parallel to the air bearing surface. FIG. 16 and FIG. 17 show the plane configuration of the composite thin film magnetic head.

In the manufacturing method according to the embodiment, first, as shown in FIGS. 1A and 1B, an insulating layer 2 made of, for example, alumina ($Al_2O_3$) is deposited in a thickness of about 2–10 $\mu$m on a substrate 1 made of, for example, altic ($Al_2O_3$—TiC).

Next, a bottom shield layer 3 for a reproducing head made of a magnetic material is formed to a thickness of 1–3 $\mu$m on the insulating layer 2 by, for example, plating. The bottom shield layer 3 corresponds to the "first magnetic shield layer" of the invention.

Next, a bottom shield gap film 4 as an insulating layer is formed by sputtering, for example, alumina or aluminium nitride to a thickness of 30–100 nm on the bottom shield layer 3. The bottom shield gap film 4 corresponds to the "first shield gap film" of the invention.

Next, an MR laminated film 5' for forming an MR device 5 for reproduction (FIGS. 2A, 2B and FIG. 11), which is to be described later, is formed to a thickness of tens of nanometers on the bottom shield gap film 4. Specifically, as shown in FIG. 9, a SAL (Soft Adjacent Layer) film 5a', an insulating film 5b' and an MR film 5c' are laminated in order by sputtering method to form the MR laminated film 5'.

The SAL film 5a' is formed to a film thickness of about 8–10 nm using materials such as nickel-ferrous-chrome-alloy (Ni—Fe—Cr) or cobalt-niobium alloy (Co—Nb) or the like. The insulating film 5b' is formed to a film thickness of about 10 nm using, for example, alumina. Further, the MR film 5c' is formed to a film thickness of about 10–15 nm using, for example, permalloy (Ni—Fe). Further, in FIG. 9, the SAL film 5a', the insulating film 5b' and the MR film 5c' are drawn thicker than they actually are compared to that of other layers.

Figure 10:
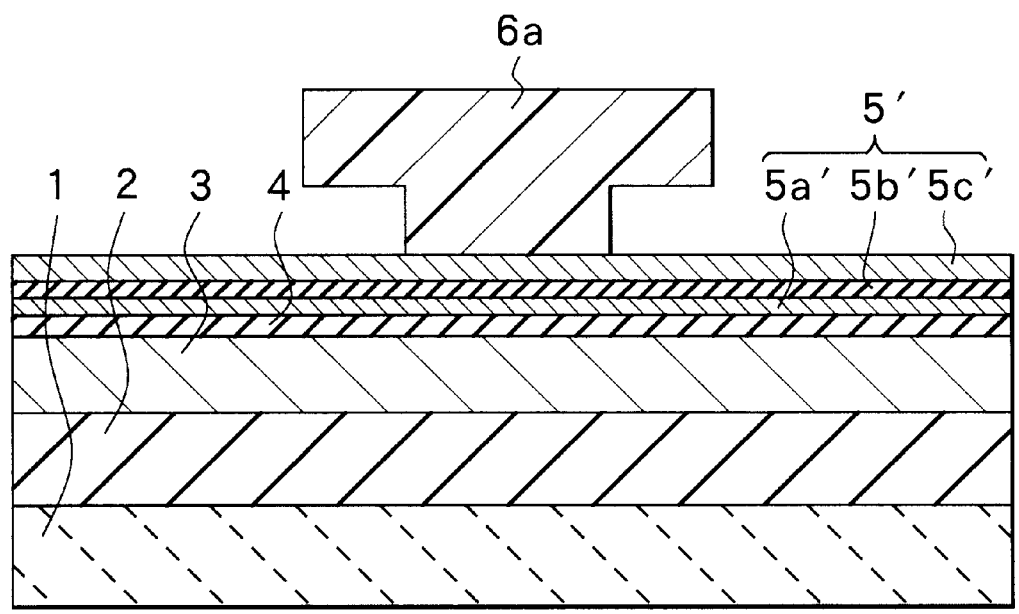
FIG. 10 is an enlarged cross section for describing a step following the step shown in FIG. 9.

Next, as shown in FIG. 10, a photoresist pattern 6a is selectively formed in a position on the MR laminated film 5', where the MR device is to be formed. At this time, the photoresist pattern 6a is made to have a T-shaped cross section so that lift-off which is to be described later can be easily performed.

Figure 11:
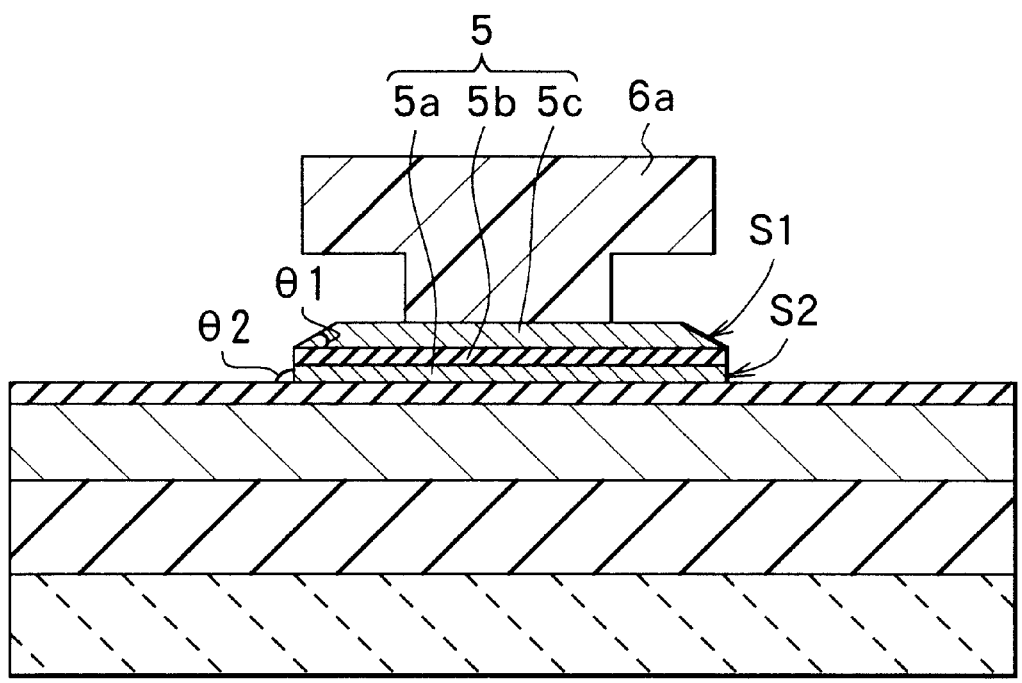
FIG. 11 is an enlarged cross section for describing a step following the step shown in FIG. 10.

Next, as shown in FIGS. 2A, 2B and FIG. 11. a pattern of the MR device 5 composed of the SAL film 5a, the insulating film 5b and the MR film 5c is formed by etching the MR laminated film 5' with the photoresist pattern 6a being a mask. The SAL film 5a is a soft film for applying a lateral magnetizing bias field to the MR film 5c. Further, the lateral magnetizing bias field is applied in order to perform reproduction using the linear region among the resistance-change curve of the MR film 5c. The SAL film 5a corresponds to the "magnetic bias film" of the invention, the insulating film 5b to the "first insulating film" of the invention, the MR film 5c to the "magnctoresistive film" of the invention, and the MR device 5 to the "magnetoresistive device" of the invention.

Formation of the MR device 5 through etching the MR laminated film 5' is performed through the following two steps.

First, the MR film 5c is formed through etching the MR film 5c' by oblique ion milling method using, for example, argon (Ar) or the like, with the photoresist pattern 6a being a mask. At this time, side-end faces S1 of the MR film 5c, which are formed after etching, are made to slope with angle θ1 of about 100°–300° toward the top surface of the bottom shield gap film 4 which is the supporting surface of the base body (that is, the top surface of the MR film 5c). Further under the MR film 5c' is the insulating film 5b' made of alumina, which has a different etching rate (specifically, lower etching rate). Accordingly, the insulating film 5b' works as etching-stopper for the MR film 5c' and etching can be performed only to the MR film 5c'. As a result, the side-end faces S1 of the etched MR film 5c become decent slopes.

Next, the insulating film 5b' and the SAL film 5a' are etched to be vertical to the supporting surface of the base body by anisotropic etching method such as RIE (reactive ion etching) or the like using, for example, tetracarbon fluoride ($CF_4$), boron chloride ($BCl_3$), chlorine ($Cl_2$) or the like with the photoresist pattern 6a being a mask. Through this, the angle formed by etched side-end faces S2 of the insulating film 5b and the SAL film 5a, and the supporting surface of the base body becomes substantially 90°. The SAL film 5a can be etched in a sputtering mode even if reactive ion etching using a gas as mentioned above is not sufficiently proceeded, since the SAL film 5a is as thin as about 8–10 nm. It is preferable to use tetracarbon fluoride as the gas used for anisotropic etching since there is less risk with tetracarbon fluoride to corrode the MR film 5c. However, corrosion can be prevented even in a case where other chlorine gas (for example, boron chloride or chlorine as mentioned) is used, provided that ion milling is performed thereafter in order to remove the chlorine gas which remains after anisotropic etching.

At this time, if the step of performing ion milling for etching the MR film 5c and the step of performing anisotropic etching for etching the insulating film 5b and the SAL film 5a are performed in the same chamber, the wafer can be continuously processed through these procedures without being exposed to the air so that corrosion of the MR film 5c may otherwise occur in the step of performing anisotropic etching can be prevented.

In the above description, the step of performing anisotropic etching for etching the insulating film 5b' and the SAL film 5a' is carried out after the step of performing ion milling for etching the MR film 5c' is completed. However, in contrast, the step of performing ion milling may be carried out after the step of performing anisotropic etching is completed. In such a case, the remaining gas such as tetracarbon fluoride, chlorine or the like used in the former step of performing anisotropic etching is removed through the latter step of performing ion milling. As a result, there is little risk of corrosion even If the MR device 5 is exposed to the air after completing the procedure.

Figure 12:
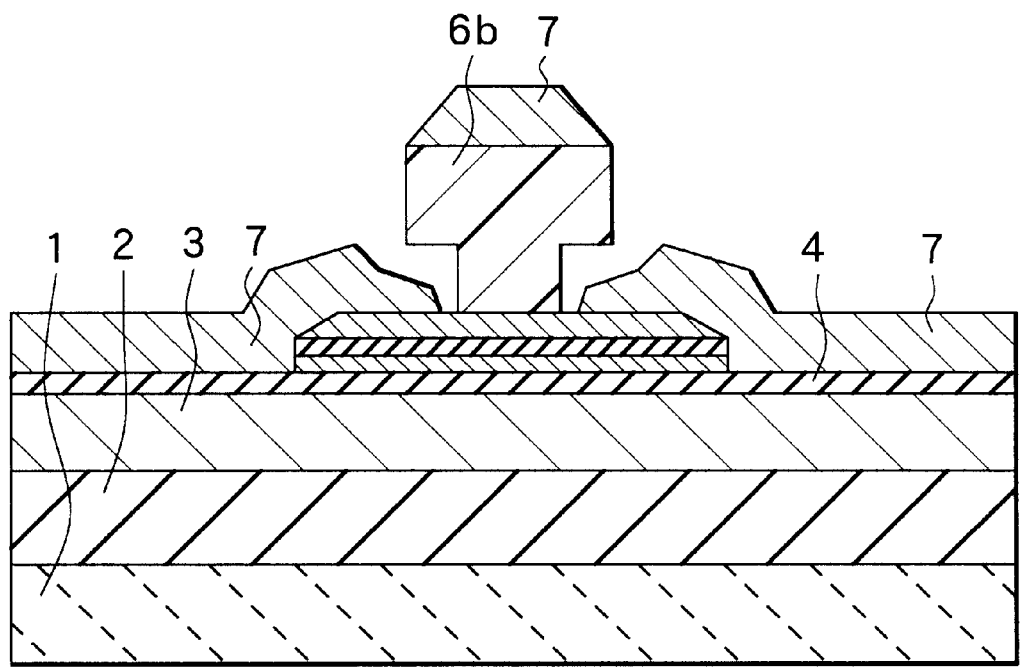
FIG. 12 is an enlarged cross section for describing a step following the step shown in FIG. 11.

Next, as shown in FIGS. 3A, 3B and FIG. 12, a photoresist pattern 6b is formed substantially in the center of the MR film 5c of the MR device 5. The photoresist pattern 6b is also formed so that its cross section takes, for example, a T-shape like the photoresist pattern 6a. The width of the photoresist pattern 6b is, however, made to be smaller than that of the photoresist pattern 6a. The track width is determined by the pattern width of the photoresist pattern 6b. Next, a pair of first electrode layers 7, which are electrically connected to the MR device 5 as an lead electrode, are formed to a thickness of about 100–200 nm on the bottom shield gap film 4 with the photoresist pattern 6b being a mask. At this time, the first electrode layers 7 are formed to be in contact with the area from the bottom shield gap film 4 to the side-end faces of the MR device 5 while covering part (both ends) of the upper region of the MR device 5. Further, the first electrode layers 7 are formed as laminated films of, for example, tantalum (Ta) and aurum (Au), of titanium-tungsten alloy (Ti—W) and cobalt-platinum alloy (Co—Pt), or of titanium nitride (TiN) and cobalt-platinum alloy.

Figure 13:
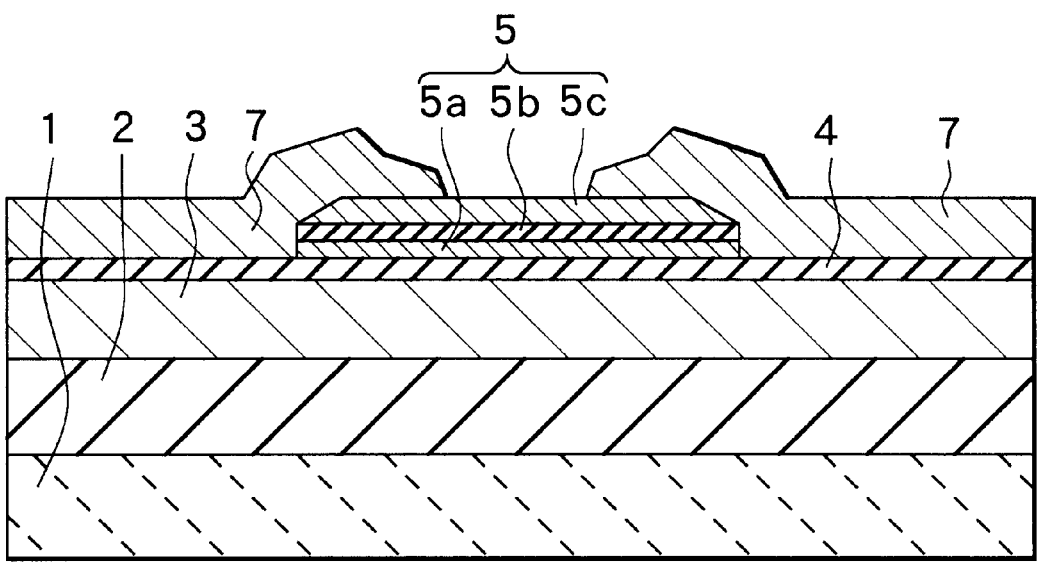
FIG. 13 is an enlarged cross section for describing a step following the step shown in FIG. 12.

Next, as shown in FIGS. 4A, 4B and FIG. 13, the photoresist pattern 6b is removed by lift-off together with the unwanted part of the first electrode layers 7. Next, a pair of second electrode layers, not shown in FIGS. 4A, 4B and FIG. 13, which are electrically connected to the first electrode layers 7 respectively in an area in the back of the paper is formed to a predetermined pattern in a thickness of 100–300 nm. The second electrode layer is made of, for example, copper (Cu). The first electrode layers 7 and the second electrode layers form a lead electrode which is electrically connected to the MR device 5, and the lead electrode corresponds to the "lead electrode layer" of the invention.

Figure 14:
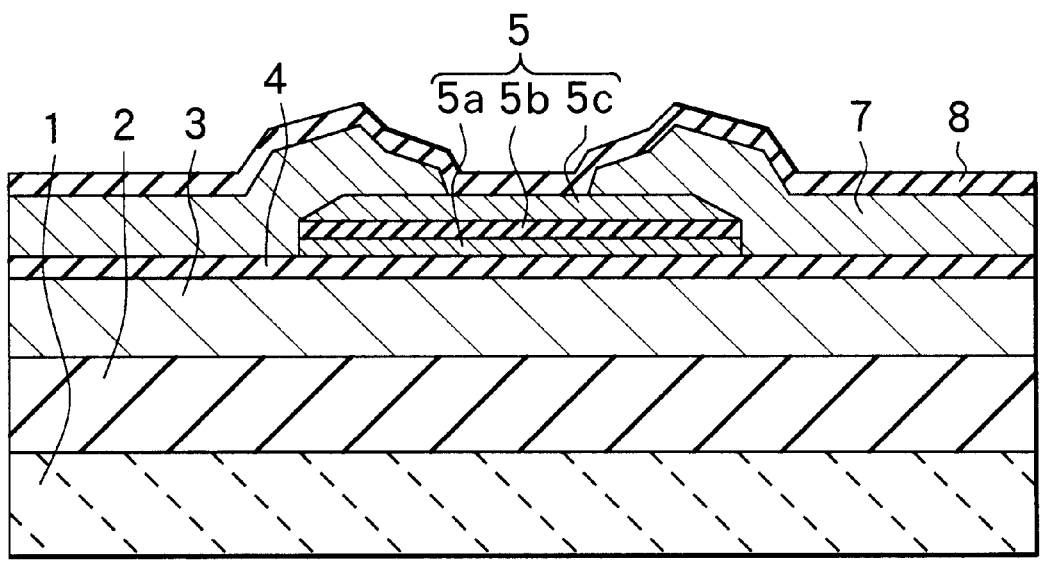
FIG. 14 is an enlarged cross section for describing a step following the step shown in FIG. 13.

Next, as shown in FIGS. 5A, 5b and FIG. 14, a top shield gap film 8 made of an insulating film such as aluminum nitride or the like is formed to a thickness of about 50–100 nm so as to cover the bottom shield gap film 4 and the MR device 5, and the MR device 5 is buried in the shield gap films 4 and 8. The top shield gap film 8 corresponds to the "second shield gap film" of the invention.

Figure 15:
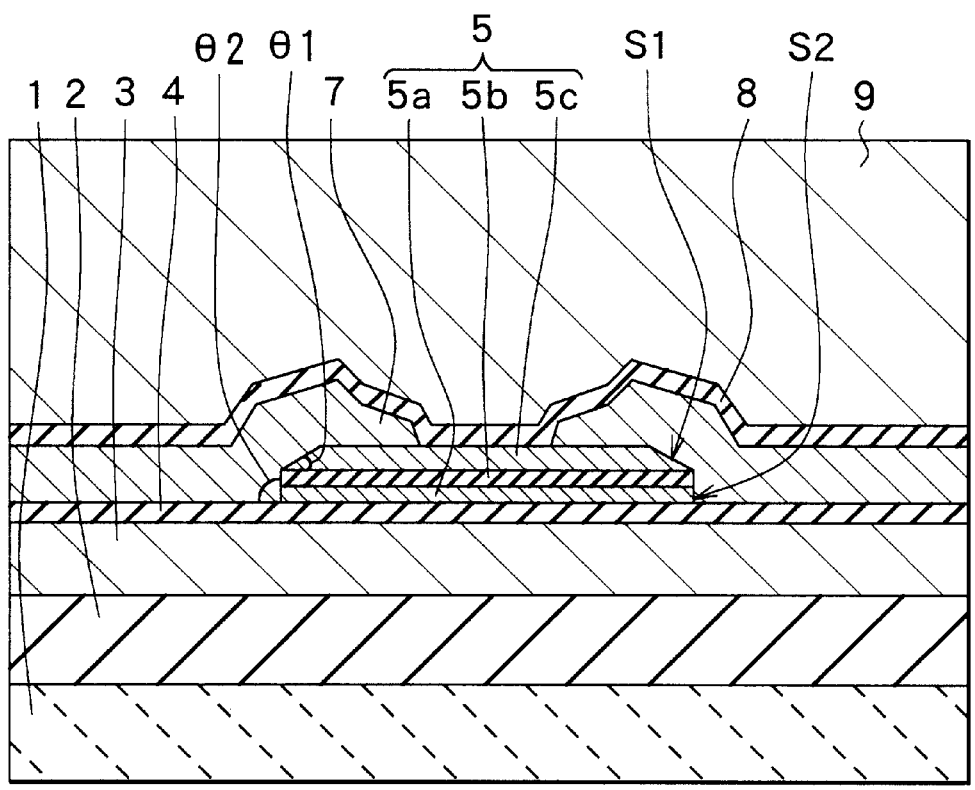
FIG. 15 is an enlarged cross section for describing a step following the step shown in FIG. 14.

Next, as shown in FIGS. 5A, 5B and FIG. 15, a top shield layer-which also works as the bottom pole (referred as top shield layer in the followings) 9 made of a magnetic material, which is used for both the reproducing head and the recording head, is formed to a thickness of about 1–4 μm on the top shield gap film 8. The top shield layer 9 corresponds to the "second shield layer" of the invention. Furthermore, the top shield layer 9, together with the bottom shield layer 3 mentioned above, corresponds to the "two magnetic shield layers" of the invention.

Next, as shown in FIGS. 6A and 6B, a write gap layer 10 made of an insulating film such as an alumina film is formed to a thickness of 0.2–0.3 μm on the top shield layer 9. A photoresist layer 11, which determines the throat height, is formed to a predetermined pattern in a thickness of about 1.0–2.0 μm on the write gap layer 10. Next, a first layer of thin film coil 12 for an inductive-type recording head is formed in a thickness of about 2–3 μm on the photoresist layer 11. Next, a photoresist layer 13 is formed to a predetermined pattern so as to cover the photoresist layer 11 and the thin film coil 12. Next, a second layer of thin film coil 14 is formed to a thickness of 2–3 μm on the photoresist layer 13. Next, a photoresist layer 15 is formed to a predetermined pattern so as to cover the photoresist layer 13 and the coil 14. The thin film coils 12 and 14 correspond to the "thin film coil" of the invention.

Next, as shown in FIGS. 7A and 7B, an opening 10a is formed in a rearward position (right-hand side in FIGS. 7A and 7B) from the coils 12 and 14 by partially etching the write gap layer 10, in order to form a magnetic path. Next, a top pole 16 made of high-saturation-flux-density material such as permalloy (NiFe) or FeN, which is the magnetic materials for the recording head is formed to a pattern in a thickness of about 3 μm so as to cover the write gap layer 10, the opening 10a, the photoresist layers 11, 13, and 15. The top pole 16 is in contact with the top shield layer (bottom pole) 9 in the opening 10a located in a rearward position of the coils 12 and 14, while being magnetically coupled to it.

Next, as shown in FIGS. 8A and 8B, the write gap layer 10 and the top shield layer (bottom pole) 9 are etched by ion milling with the top pole 16 being a mask. Next, an overcoat layer 17 made of, for example, alumina is formed to a thickness of 20–30 μm on the top pole 16. At last, a composite thin film magnetic head is completed after air bearing surfaces of the recording head and the reproducing head are formed by performing machine processing on the slider. As shown in FIGS. 8A and 8B, a configuration in which each side-wall of the top pole 16, the write gap layer 10 and part of the top shield layer (bottom pole) 9 are formed to be vertical in a self-aligned manner is called a trim structure. With the trim structure, it is possible to suppress the increase in the effective track width, due to spread of magnetic flux generated at the time of writing of the narrow track. The bottom pole 9 and the top pole 16 correspond to the "two magnetic layers" of the invention, and the portion including the bottom pole 9, the top pole 16, the thin film coils 12, 14, and the write gap layer 10 corresponds to the "inductive-type magnetic transducer" of the invention.

FIG. 16 is a plan view of a thin film magnetic head manufactured as described above. The overcoat layer 17 is omitted in FIG. 16. FIG. 17 is a plan view showing a state after the MR device 5, the first electrode layers 7, and the second electrode layers 18 being formed on the bottom shield gap film 4. Further, in FIG. 1 to FIG. 8, "A" shows a cross section taken along the line A–A' in FIG. 16, and "B" shows a cross section taken along the line B–B' in FIG. 16.

Next, distinctive functions of the reproducing head, among the thin film magnetic head formed as described above, will be described.

As shown in FIG. 15, the MR device 5 composing the main portion of the reproducing head is formed as a laminated structure in which the SAL film 5a, the insulating film 5b and the MR film 5c are laminated. Among these, the side-end faces S1 of the MR film 5c which compose the main portion of the MR device 5 slope toward the supporting surface of the base body (that is, the top surface of the bottom shield gap film 4) and the angle θ1 formed by them is as small as 10–30°. On the other hand, the angle θ2 formed by the side-end faces S2 of the SAL film 5a for applying lateral magnetizing bias field and the supporting surface of the base body is substantially 90°. Accordingly, the area of the side-end faces of the SAL film 5a becomes considerably smaller than that of the MR film 5c even if the film thickness of the SAL film 5a and the MR film 5c are about the same. The contact resistance of the SAL film 5a and the first electrode layer 7 therefore becomes sufficiently larger than that of the MR film 5c and the first electrode layer 7. As a result, current flowing in the SAL film 5a becomes sufficiently smaller than that of the MR film 5c. Specifically, it is possible to make the current flowing in the SAL film 5a about 5–10% of the total current by setting the angle formed by the side-end faces of the MR film 5c and the supporting surface of the base body, and the film thickness of the MR film 5c and the SAL film 5a to the proper values. Accordingly, most of the current flowing in the MR device 5 flows into the MR film 5c so that output can be improved by about 30–50% compared to the MR-type reproducing head of the related art.

Further, in the embodiment, an insulating film is not provided in the side face of the MR device 5 like the related art. Accordingly, there is no such problems that the amount of the current flowing in the MR film 5c varies due to the fact that insulating ability of the insulating film is violated if there exists such as pin holes resulted from such as the overhung insulating film 5b. Further, in the embodiment, the ratio of the area of the side-end faces (slopes) of the MR film 5c to the area of the side-end faces (vertical surfaces) of the SAL film 5a can be made precisely constant. Therefore, the ratio of the value of the contact resistance between the MR film 5c and the first electrode layers 7 to the value of the contact resistance between the SAL film 5a and the first electrode layers 7 can be made constant. In other words, the ratio of the current flowing in the MR film 5c to the current flowing in the SAL film 5a can be made constant. As a result, reproducing output is stabilized practically without the current flowing in the MR film 5c being changed due to a factor other than change in the magnetic field from the recording medium.

As described above, in the embodiment, it is possible to make most of the current flowing in the MR device 5 flow into the MR film 5c while the ratio of the value of the current flowing in the MR film 5c to that of the SAL film 5a can be made precisely constant. As a result, a high-level reproducing output with high stability can be obtained.

[Second Embodiment]

Next, a second embodiment of the invention will be described.

In the embodiment, an insulating film 5d which covers the side-end faces of the MR device 5 is further provided in addition to the configuration of the composite thin film magnetic head according to the first embodiment mentioned above. The manufacturing method will be described with reference to FIG. 18 to FIG. 24 in the followings. FIG. 18 to FIG. 24 show enlarged cross sections of the magnetic pole portion parallel to the air bearing surface and substantially correspond to FIG. 9 to FIG. 15 of the first embodiment mentioned above. Further, figures showing the whole steps of the method of manufacturing a composite thin film magnetic head according to the embodiment are not shown, since they are similar to FIGS. 1A, 1B to FIGS. 8A, 8B, FIG. 16 and FIG. 17 of the first embodiment, except that there is a step of providing the insulating film 5d covering the side-end faces of the MR device 5. Further, in FIG. 18 to FIG. 24 shown in the embodiment, identical numerals are adopted to the components corresponding to those of the first embodiment mentioned above.

Figure 18:
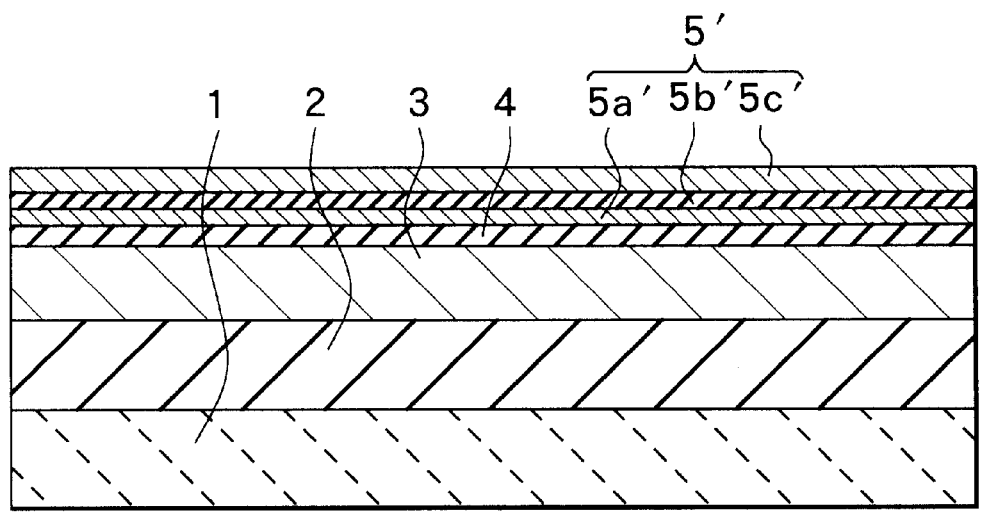
FIG. 18 is a cross section for describing one step in a method of manufacturing a thin film magnetic head according to a second embodiment of the invention, and is an enlarged cross section parallel to the air bearing surface.

In the embodiment, first, as shown in FIG. 18, the insulating layer 2, the bottom shield layer 3 and the bottom shield gap film 4 are formed in order on the substrate 1. The SAL film 5a', the insulating film 5b' and the MR film 5c' are laminated in order on the bottom shield gap film 4 to compose the MR laminated film 5'.

Figure 19:
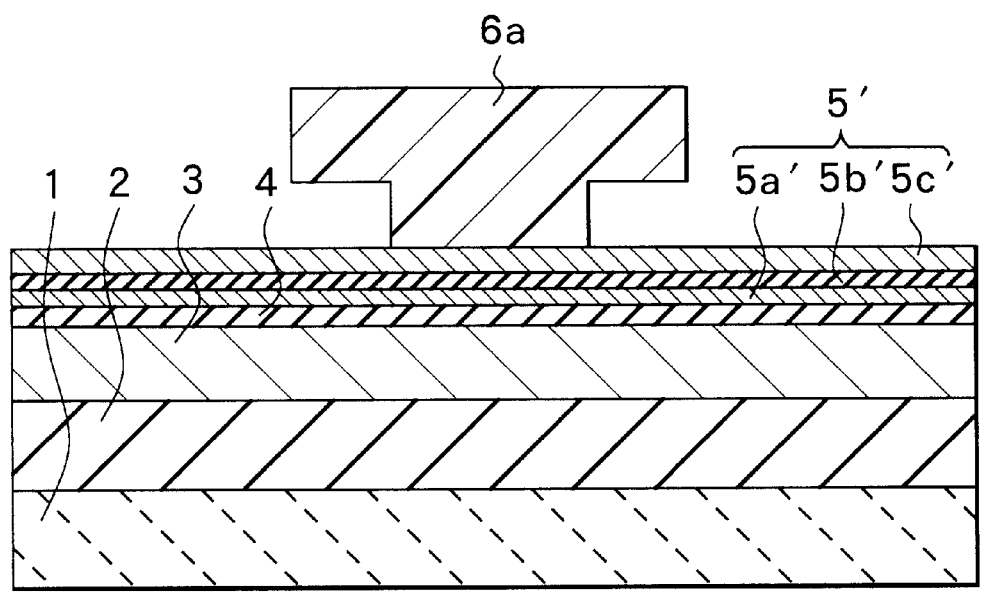
FIG. 19 is an enlarged cross section for describing a step following the step shown in FIG. 18.
Figure 20:
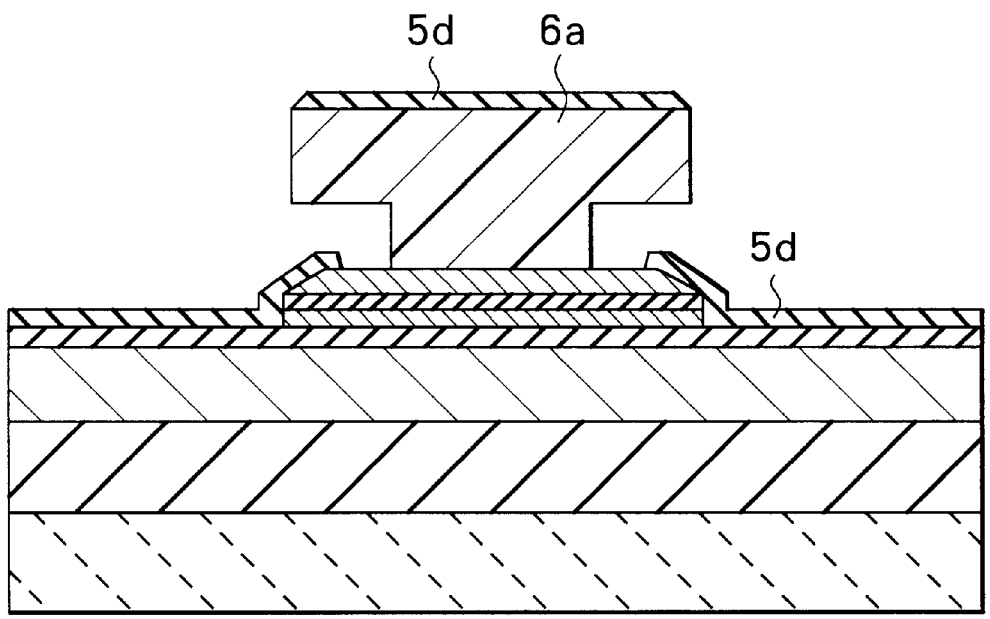
FIG. 20 is an enlarged cross section for describing a step following the step shown in FIG. 19.

Next, as shown in FIG. 19, after a photoresist pattern 6a is selectively formed in a position on the MR laminated film 5', where the MR device 5 is to be formed, a pattern of the MR device 5 composed of the SAL film 5a, the insulating film 5b and the MR film 5c is formed by etching the MR laminated film 5' with the photoresist pattern 6a being a mask, as shown in FIG. 20. The SAL film 5a corresponds to the "magnetic film for applying magnetizing bias field" of the invention, the insulating film 5b to the "first insulating film" of the invention, the MR film 5c to the "magnetoresistive film" of the invention, and the MR device 5 to the "magnetoresistive device" of the invention.

Further, the steps described heretofore are similar to the steps described with reference to FIGS. 1A, 1B and FIGS. 2A, 2B in the first embodiment mentioned above. Further, the method of forming each layer is similar to that of the first embodiment so that the detailed description will be omitted.

Next, as shown in FIG. 20, the insulating film 5d made of, for example, alumina is formed to a thickness of, for example, 10 nm by using the photoresist pattern 6a as a mask which is used at the time of forming the MR device 5. Through this, each of the side-end faces of the SAL film 5a, the insulating film 5b and the MR film 5c composing the MR device 5 are covered with the insulating film 5d. Next, the photoresist pattern 6a is removed by lift-off together with the unwanted part of the insulating film 5d. The insulating film 5d corresponds to the "second insulating film" of the invention.

Figure 21:
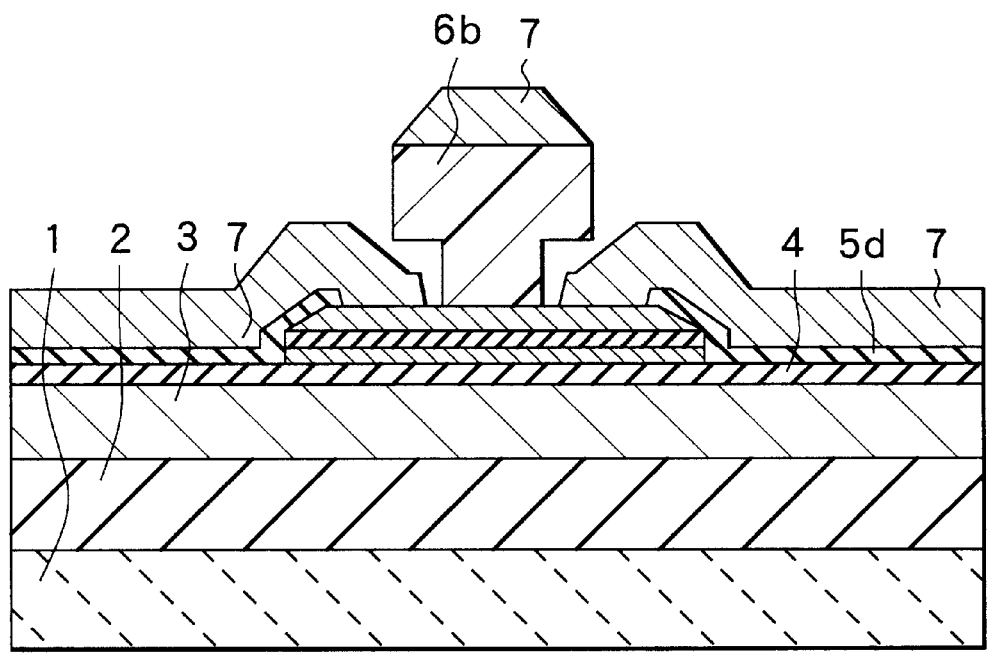
FIG. 21 is an enlarged cross section for describing a step following the step shown in FIG. 20.

Next, as shown in FIG. 21, a photoresist pattern 6a with a T-shaped cross section is formed substantially in the center of the MR film 5c of the MR device 5. Further, a pair of the first electrode layers 7, which are electrically connected to the MR device 5 as lead electrodes are formed on the bottom shield gap film 4 with the photoresist pattern 6a being a mask. At this time, the first electrode layers 7 are insulated from the side-end faces of the MR device 5 by the insulating film 5d covering the area from the bottom shield gap film 4 to the side-end faces of the MR device 5. Further, the first electrode layers 7 are electrically connected to the MR film 5c to part (both ends) of the top surface of the MR film 5c of the MR device 5.

Figure 22:
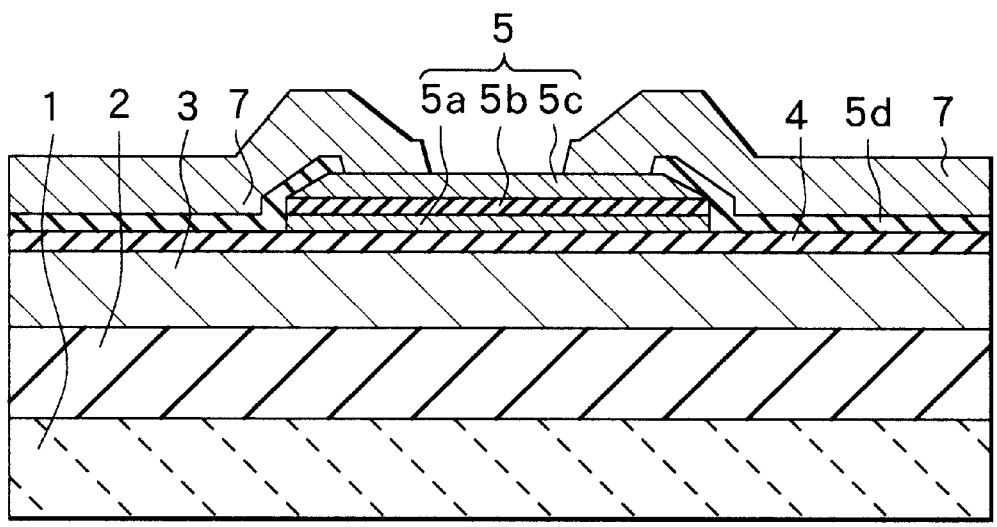
FIG. 22 is an enlarged cross section for describing a step following the step shown in FIG. 21
Figure 23:
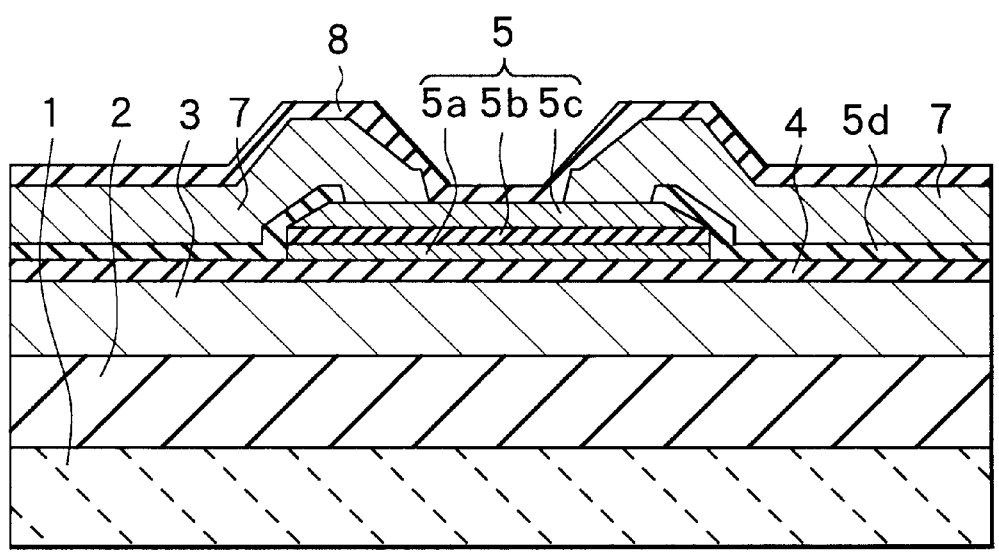
FIG. 23 is an enlarged cross section for describing a step following the step shown in FIG. 22.
Figure 24:
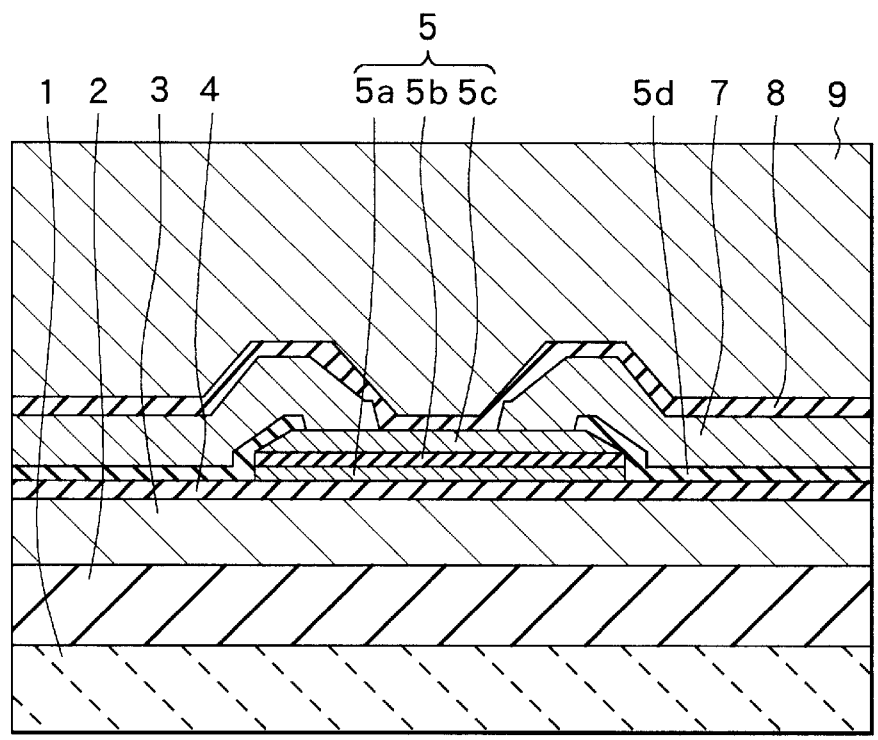
FIG. 24 is an enlarged cross section for describing a step following the step shown in FIG. 23.

The following steps are similar to those of the first embodiment. That is, as shown in FIG. 22, after the photoresist pattern 6b is removed by lift-off together with the unwanted part of the first electrode layers 7, a pair of the second electrode layers (not shown), which are electrically connected to the first electrode layers 7 in an area in the back of the paper, are formed to a predetermined pattern. Next, as shown in FIG. 23, a top shield gap film 8 is formed so as to cover the bottom shield gap film 4 and the MR device 5, and the MR device 5 is buried between the shield gap films 4 and 8. Next, as shown in FIG. 24, a top shield layer 9 is formed on the shield gap film 8.

Next, a thin film magnetic head is completed by forming the recording head portion through the same steps shown in FIGS. 6A, 6B to FIGS. 8A, 8B in the first embodiment mentioned above. Detailed description of the step of forming the recording head portion will be omitted.

Other configurations of the embodiment are similar to those of the first embodiment.

In the composite thin film magnetic head according to the embodiment, the side-end faces of the MR film 5c, among layers composing the MR device 5, slope toward the supporting surface of the base body while the side-end faces of the SAL film 5a are formed to be substantially vertical to the supporting surface of the base body. Further, the insulating film 5d is provided between the side-end faces of the MR device 5 and the first electrode layers 7. Thereby, as a rule, current does not flow into the SAL film 5a and the whole current flowing in the MR device 5 flows into the MR film 5c. As a result, reproducing output is further improved and the reproducing output increases around twice as much as that of the related art.

Further, in the embodiment, as described with reference to FIG. 20 (practically, FIG. 11 is being cited), the MR film 5c is obliquely etched by ion milling while the insulating film 5b and the SAL film 5a are vertically etched by anisotropic etching. As a result, unlike the case of the related art in which all of the three layers are obliquely etched by ion milling, the edge of the insulating film 5b does not protrude from the edges of the other layers and overhung shape is not formed. Accordingly, pin holes are not likely to be formed in the side walls of the MR device 5, that is, in the insulating film 5d formed to cover the side-end faces of the SAL film 5a, the insulating film 5b and the MR film 5c, unstable factor that insulating ability of the insulating film 5b varies may decrease. As a result, there is less variations in the amount of sense current flowing in the MR film 5c so that stability of the reproducing output of the MR device 5 can be insured. Further, even if the pin holes are formed in the insulating film 5d between the SAL film 5a and the first electrode layers 7 for some reasons, there is little possibility for the value of the current flowing in the MR film 5c to be affected by existence of the pin holes. Because the amount of the current flowing in the SAL film 5a is very small from the beginning due to the fact that the area of the side-end faces of the SAL film 5a is extremely small. Accordingly, variations of the reproducing output performance among each reproducing head is small enough not to cause a problem.

Although, the whole side-end faces (that is, side-end faces S1 of the MR film 5c, side-end faces of the insulating film 5b and side-end faces S2 of the SAL film 5a) of the MR device 5 are made to be covered with the insulating film 5d in the embodiment, the invention is not limited to this. Only the side-end faces of the SAL film 5a among the MR device 5 may be covered with the insulating film 5d. In such a case, the slopes (side-end faces S1) of the MR film 5c are to be also in contact with the first electrode layers 7 in addition to the end portion of the upper surface. As a result, it is preferable since contact resistance becomes smaller and the current flowing in the MR film 5c becomes larger.

[Third Embodiment]

Now, a third embodiment of the invention will be described.

Figure 25:
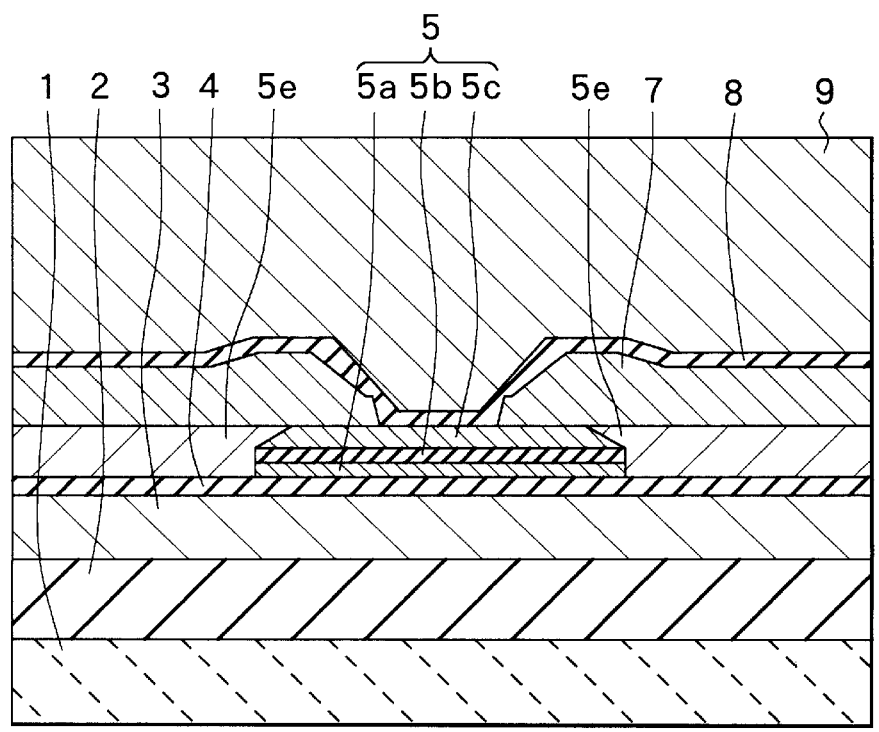
FIG. 25 is a cross section for describing one step in a method of manufacturing a thin film magnetic head according to a third embodiment of the invention, and is an enlarged cross section parallel to the air bearing surface.
Figure 26:
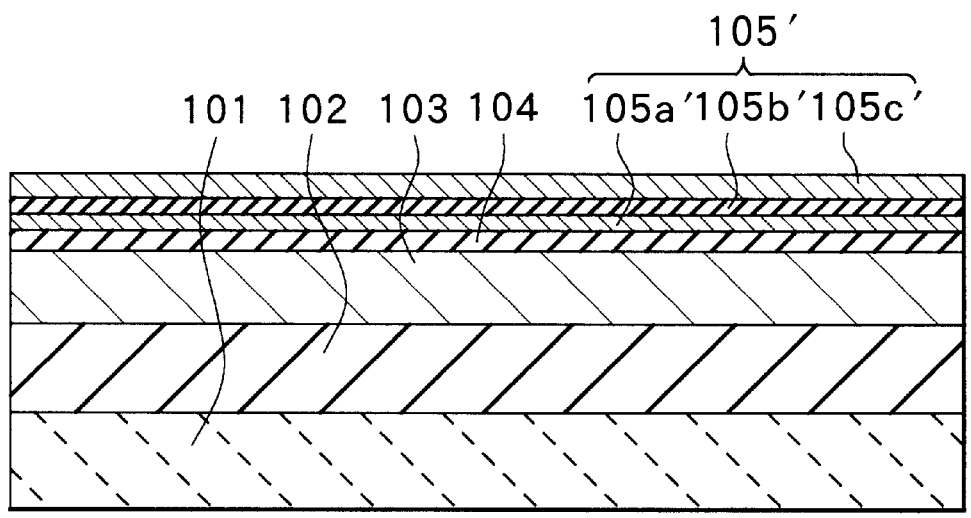
FIG. 26 is a cross section for describing one step in a method of manufacturing a thin film magnetic head of the related art, and is an enlarged cross section parallel to the air bearing surface.
Figure 27:
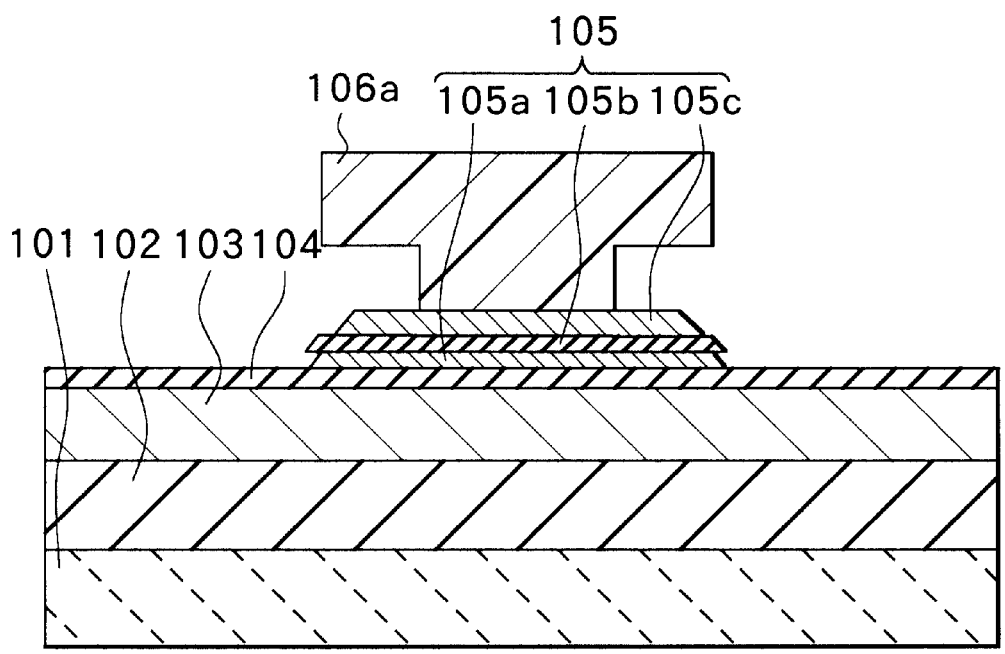
FIG. 27 is a cross section for describing a step following the step shown in FIG. 26.
Figure 28:
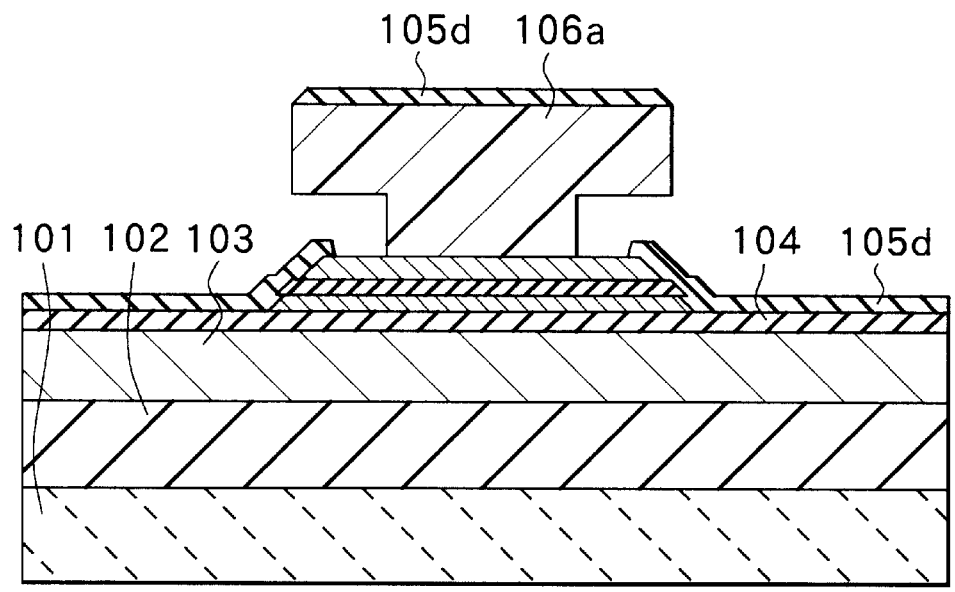
FIG. 28 is a cross section for describing a step following the step shown in FIG. 27.
Figure 29:
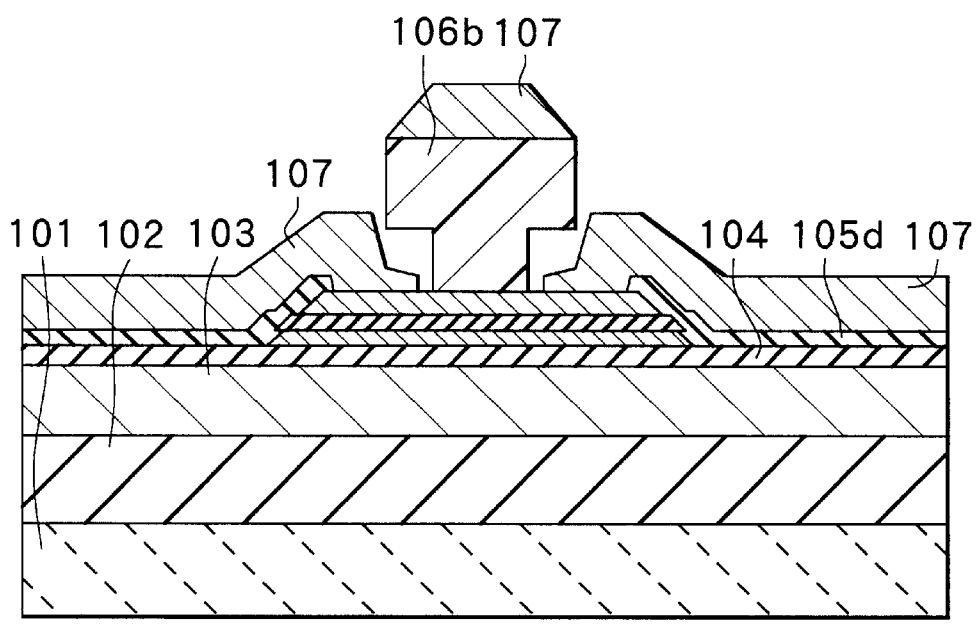
FIG. 29 is a cross section for describing a step following the step shown in FIG. 28.
Figure 30:
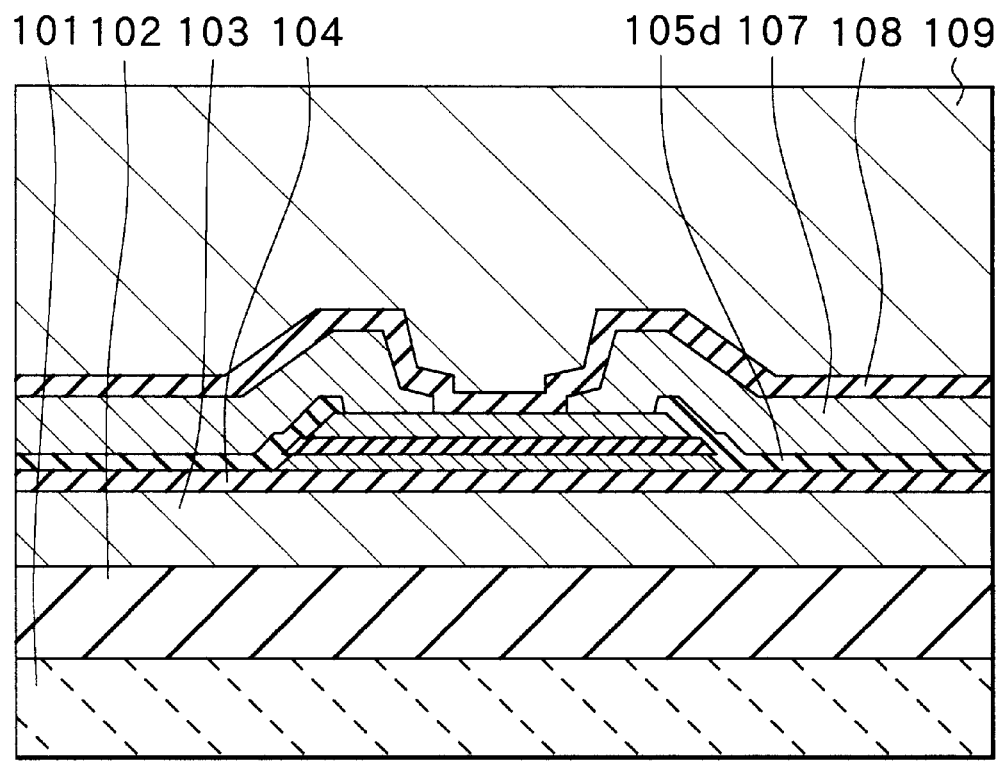
FIG. 30 is a cross section for describing a step following the step shown in FIG. 29.
Figure 31:
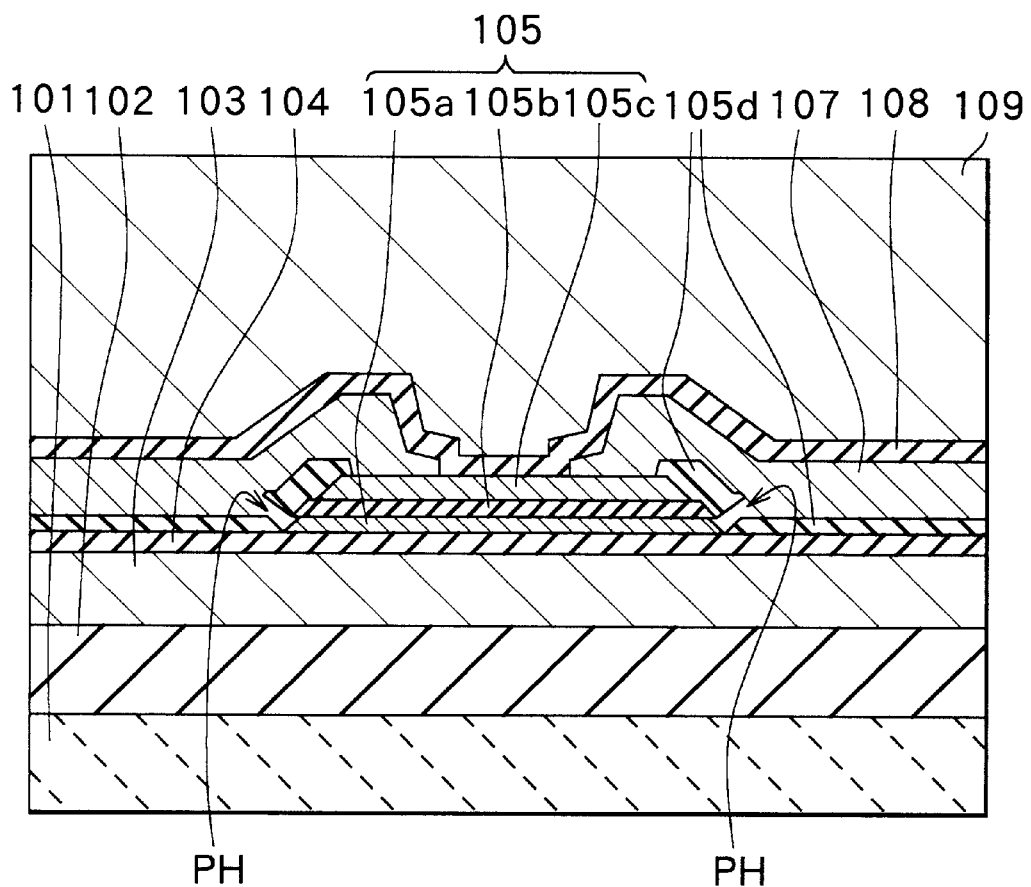
FIG. 31 is a cross section for describing the problems in a thin film magnetic head of the related art and a method of manufacturing the same, and is an enlarged cross section parallel to the air bearing surface.

As shown in FIG. 25, the reproducing heads of the embodiment, further has permanent magnet layers 5e as a means for applying longitudinal magnetizing bias field in addition to the configuration of the reproducing head of the composite thin film magnetic head shown in the first embodiment (FIG. 15). The permanent magnet layers 5e sandwich the MR device 5 from both sides under a pair of the first electrode layers 7 on both sides of the MR device 5. Here, the longitudinal magnetizing bias field is a magnetizing bias field applied to the same direction as the direction of the current flowing in the MR film 5c. The permanent magnet layer 5e is so-called a hard film and is formed using, for example, cobalt chrome platinum (Co—Cr—Pt) alloy, cobalt-chrome (Co—Cr) alloy or the like. In such a case, the first electrode layers 7 are electrically connected to the MR film 5c in both sides of the surface thereof.

Other configurations of the embodiment are similar to those of the first embodiment.

In the embodiment, the permanent magnet layer 5e, which applies the longitudinal magnetizing bias field to the MR film 5c, is provided so that so-called Barkhausen noise generated by domain-wall shift of magnetic domain into the MR film 5c can be suppressed. As a result, S/N ratio of reproducing output can increased. Further, in the embodiment, since the permanent magnet layer 5e has conductivity, current also flows into the SAL film 5a. However, the amount of the current is very little since the area of the side-end faces of the SAL film 5a is small. Accordingly, the reproducing output is improved as well as that of the first embodiment.

Further, in the embodiment, the same thin insulating film 5d as the one mentioned in the second embodiment may also be provided between the side-end faces (at least side-end faces of the SAL film 5a) of the MR device 5 and the permanent magnet layer 5e. In such a case, the reproducing output can be further increased.

The permanent magnet layers 5e may be replaced with a magnetic layer in which a ferromagnetic film and antiferromagnetic film are laminated as a means for applying the longitudinal magnetizing bias field.

Although the invention has been described by referring to some embodiments, however, it is not limited to the embodiments but various kinds of modifications are possible. For example, in the embodiments described above, a soft film (SAL film 5a) is used as the magnetic film for applying the lateral magnetizing bias field to the MR film 5c. However, it is not limited to this, but a specific magnetic field may be applied by using other kinds of magnetic film such as a hard magnetic film, or a laminated film in which an antiferromagnetic film and a ferromagnetic film are laminated.

Further, in each of the embodiments described above, a case of applying the magnetoresistive device of the invention to a composite thin film magnetic head is described, however, it can also be applied to a thin film magnetic head for reproducing only.

Further, the magnetoresistive device of the invention may be applied to, for example, an acceleration sensor for sensing acceleration or a memory for storing magnetic signals.

As described above, in the magnetoresistive device, the thin film magnetic head, the method of manufacturing the magnetoresistive device or the method of manufacturing the thin film magnetic head of the invention, the side-end faces of the magnetoresistive film are made to slope toward the supporting surface of the base body, and at least the side-end faces of the magnetic film for applying lateral magnetizing bias field are made substantially vertical to the supporting surface of the base body. As a result, the current flowing in the magnetoresistive device can be increased while the amount of the current can be set to a constant value. Accordingly, a stable high sensitivity for the magnetoresistive device can be attained. Further, when the thin film magnetic head of the invention to which the magnetoresistive device is applied is used for, for example, reproducing, a stable and high reproducing output can be obtained.

Especially, in the magnetoresistive device in one aspect of the invention, the thin film magnetic head to which the magnetoresistive device is applied, the method of manufacturing the magnetoresistive device, or the method of manufacturing the thin film magnetic head to which the method of the manufacturing the magnetoresistive device is applied to, the side-end faces (slopes) of the magnetoresistive film and the side-end faces (vertical surfaces) of the magnetic film for applying magnetizing bias field are made to be electrically connected to the lead electrode layer. Accordingly, the contact area between the side-end faces of the magnetoresistive film and the lead electrode layer is large and the contact resistance is small while the contact area between the side-end faces of the magnetic film for applying magnetizing bias field and the lead electrode layer becomes small and the contact resistance becomes large. As a result, a large amount of the current flows into the magnetoresistive film so that the sensitivity as the magnetoresistive device is improved. Further, in such a case, the ratio of the amount of the current flowing in the magnetoresistive film to the amount of the current flowing in the magnetic film for applying magnetizing bias field depends on the respective contact areas. The ratio can be set to a constant value so that the sensitivity of the magnetoresistive device is stabilized. Accordingly, in a case where the thin film magnetic head of the invention to which such magnetoresistive device is applied is used for, for example, reproducing, improving and stabilizing the reproducing output can be achieved at the same time.

Further, in the magnetoresistive device in another aspect of the invention, the thin film magnetic head to which the magnetoresistive device is applied, the method of manufacturing the magnetoresistive device, or the method of manufacturing the thin film magnetic head to which the method of the manufacturing the magnetoresistive device is applied to, the vertical side-end faces of the magnetic film for applying magnetizing bias field are further made to be covered with a second insulating film so that, as a rule, the current flows only into the magnetoresistive film without flowing in the magnetic film for applying magnetizing bias field. As a result, the sensitivity of the magnetoresistive device is further improved. Further, a problem of the difference the insulating ability of the second insulating film due to the shape of the side-end faces of the magnetic film for applying bias magnetic filed is not likely to occur. As a result, the sensitivity of the magnetoresistive device is further stabilized. Accordingly, when the thin film magnetic head of the invention to which the magnetoresistive device is applied is used for, for example, reproducing, a more stable and higher reproducing output can be obtained.

Obviously many modifications and variations of the present invention are possible in the light of above teachings. It is therefore to understood that within the scope of the appended claims the invention may be practiced otherwise than as specifically described.

What is claimed is:

1. A magnetoresistive device, comprising:
    a magnetoresistive film extending in a first direction and having side-end faces;
    a magnetic bias film for applying magnetizing bias field extending in the first direction and having side-end faces;
    a first insulating film made of an electrically insulating material for magnetically and electrically isolating the magnetoresistive film from the magnetic bias film, the first insulating film being sandwiched between the magnetoresistive film and the magnetic bias film and having side-end faces;
    lead electrodes placed to be electrically connected to at least the magnetoresistive film; and
    a base body having a supporting surface which extends in the first direction so as to support the magnetoresistive film, the first insulating film, the magnetic bias film and the lead electrode layer; wherein:
        the side-end faces of the magnetoresistive film are sloping at 10 to 30 degrees from the supporting surface of the base body; and
        the side-end faces of both of the magnetic bias film and the first insulating film are substantially perpendicular to the supporting surface of the base body.

2. A magnetoresistive device according to claim 1, wherein the magnetic bias film is for applying a lateral magnetizing bias field, which is orthogonal to the direction of current for sensing resistance change flowing in the magnetoresistive film, to the magnetoresistive film.

3. A magnetoresistive device according to claim 1, wherein the magnetic bias film is formed using a soft magnetic film.

4. A thin film magnetic head comprising a magnetoresistive device for reproducing information from a recording medium; wherein:
    the magnetoresistive device has a configuration according to claim 1.

5. A thin film magnetic head according to claim 4 further comprising two magnetic shield layers for magnetically shielding the magnetoresistive device from others, placed to sandwich the magnetoresistive device in between.

6. A thin film magnetic head according to claim 5 further comprising:
    an inductive-type magnetic transducer including:
        two magnetic layers magnetically coupled to each other, each made of at least one layer, including magnetic poles in part of sides of the area facing a recording medium, the magnetic poles being opposed to each other with a gap layer in between; and a thin film coil provided between the two magnetic layers.

7. A thin film magnetic head according to claim 4 further comprising an inductive-type magnetic transducer including:

two magnetic layers magnetically coupled to each other, each made of at least one layer, including magnetic poles in part of sides of the area facing a recording medium, the magnetic poles being opposed to each other with a gap layer in between; and a thin film coil provided between the two magnetic layers.

8. A magnetoresistive device, comprising:

a magnetoresistive film extending in a first direction and having side-end faces;

a magnetic bias film for applying magnetizing bias field extending in the first direction and having side-end faces;

a first insulating film made of an electrically insulating material for magnetically and electrically isolating the magnetoresistive film from the magnetic bias film, the first insulating film being sandwiched between the magnetoresistive film and the magnetic bias film and having side-end faces;

lead electrodes placed to be electrically connected to at least the side-end face of the magnetoresistive film and the side-end faces of the magnetic bias film; and a base body with a supporting surface which extends in the first direction so as to support the magnetoresistive film, the first insulating film, the magnetic bias film and the lead electrode layer; wherein:

the side-end faces of the magnetoresistive film are sloping at 10 to 30 degrees from the supporting surface of the base body; and the side-end faces of both the magnetic bias film and the first insulating film are substantially perpendicular to the supporting surface of the base body.

9. A magnetoresistive device according to claim 8, wherein the magnetic bias film is for applying a lateral magnetizing bias field, which is orthogonal to the direction of current flowing in the magnetoresistive film for sensing resistance change, to the magnetoresistive film.

10. A magnetoresistive device according to claim 8, wherein the magnetic bias film is formed using a soft magnetic film.

11. A magnetoresistive device, comprising:

a magnetoresistive film extending in a first direction and having side-end faces and a top surface;

a magnetic bias film for applying magnetizing bias field extending in the first direction and having side-end faces;

a first insulating film made of an electrically insulating material for magnetically and electrically isolating the magnetoresistive film from the magnetic bias film, the first insulating film being sandwiched between the magnetoresistive film and the magnetic bias film and having side-end faces;

a second insulating film placed to cover at least the side-end faces of the magnetic bias film;

lead electrodes placed to be electrically connected to at least either the side-end faces or the top surface of the magnetoresistive film; and a base body with a supporting surface which extends in the first direction so as to support the magnetoresistive film, the first insulating film, the magnetic bias film, the lead electrode layer and the second insulating film, wherein:

the side-end faces of the magnetoresistive film are sloping at 10 to 30 degrees from the supporting surface of the base body; and the side-end faces of both of the magnetic bias film and the first insulating film are substantially perpendicular to the supporting surface of the base body.

12. A magnetoresistive device according to claim 11, wherein the magnetic bias film is for applying a lateral magnetizing bias field, which is orthogonal to the direction of current flowing in the magnetoresistive film for sensing resistance change, to the magnetoresistive film.

13. A magnetoresistive device according to claim 11, wherein the magnetic bias film is formed using a soft magnetic film.

* * * * *